United States Patent
Shimamoto et al.

(10) Patent No.: US 8,018,287 B2
(45) Date of Patent: *Sep. 13, 2011

(54) RF POWER AMPLIFIER APPARATUS AND POWER SUPPLY CIRCUIT FOR CONTROLLING POWER-SUPPLY VOLTAGE TO RF POWER AMPLIFIER

(75) Inventors: Kenichi Shimamoto, Tokyo (JP); Hisanori Namie, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/906,417

(22) Filed: Oct. 18, 2010

(65) Prior Publication Data

US 2011/0032038 A1    Feb. 10, 2011

Related U.S. Application Data

(63) Continuation of application No. 12/251,900, filed on Oct. 15, 2008, now Pat. No. 7,839,218.

(30) Foreign Application Priority Data

Oct. 16, 2007   (JP) .................................. 2007-269160

(51) Int. Cl.
*H03F 3/04*    (2006.01)

(52) U.S. Cl. ........................................ 330/298; 330/297
(58) Field of Classification Search ................... 330/51, 330/297, 298
See application file for complete search history.

(56) References Cited

U.S. PATENT DOCUMENTS

| | | | |
|---|---|---|---|
| 6,615,028 B1 * | 9/2003 | Loke et al. ................ | 455/127.1 |
| 7,173,491 B2 | 2/2007 | Bocock et al. | |
| 7,193,474 B2 * | 3/2007 | Phillips et al. ............... | 330/298 |

* cited by examiner

*Primary Examiner* — Robert Pascal
*Assistant Examiner* — Khiem D Nguyen
(74) *Attorney, Agent, or Firm* — Mattingly & Malur, PC

(57) ABSTRACT

The RF power amplifier apparatus has an RF power amplifier and a power-supply circuit. The power-supply circuit controls the level of a source voltage supplied to the RF power amplifier in response to the level of a power-control signal. A sensing resistance produces a sense signal Vsen corresponding to a source current with respect to a source voltage. The current-control unit controls the source current $I_{LDO}$ in response to the sense signal Vsen. When Vsen coincides with an allowable sense signal level Vsh corresponding to a source current allowable level $I_{LDO}$(Max), the current-control unit controls the source current $I_{LDO}$ to a limit current smaller than the allowable level $I_{LDO}$(Max). Preferably, the limit current is a shutdown current when a shutdown switch is in an OFF state. Thus, the draining of the battery of a mobile-phone terminal can be reduced even when an impedance mismatch condition lasts for a long time.

3 Claims, 8 Drawing Sheets

RF POWER AMPLIFIER APPARATUS AND POWER SUPPLY CIRCUIT FOR CONTROLLING POWER-SUPPLY VOLTAGE TO RF POWER AMPLIFIER

CROSS REFERENCES

This is a continuation application of U.S. Ser. No. 12/251,900, filed Oct. 15, 2008 (now U.S. Pat. No. 7,839,218).

CLAIM OF PRIORITY

The Present application claims priority from Japanese application JP 2007-269160 filed on Oct. 16, 2007, the content of which is hereby incorporated by reference into this application.

FIELD OF THE INVENTION

The present invention relates to an RF power amplifier apparatus for RF transmission and a power-supply circuit, both incorporated in a mobile-phone terminal which communicates with a base station. Particularly, it relates to a technique useful to reduce the drain of a battery of a mobile-phone terminal even when the condition of impedance mismatch continues for a long time.

BACKGROUND OF THE INVENTION

For communication terminal devices such as mobile-phone terminals, a Time Division Multiple Access(TDMA) system has been known, in which time slots can be set for one of an idle state, an action of reception from a base station and an action of transmission to abase station. A Global System for Mobile Communication (GSM) or Gaussian Minimum Shift Keying (GMSK) system are types of such TDMA systems in which only phase modulation is used.

Also, a system having an improved communication data transfer rate in comparison to GSM or GMSK systems has been known. As such an improved system, an Enhanced Data for GSM Evolution, or Enhanced Data for General Packet Radio Service (GPRS),(EDGE) system, in which amplitude modulation is used as well as phase modulation, has been in the spotlight recently.

A polar loop system has been known as a method to realize an EDGE system, by which after a transmit signal to be transmitted is separated into a phase component and an amplitude component, the phase and amplitude components undergo feedback-control using a phase-control loop and an amplitude-control loop respectively, and an amplifier combines the phase and amplitude components after the feedback control.

Non-patent Document 1, which is to be cited later, describes a polar loop transmitter having a phase-control loop and an amplitude-control loop and which supports an EDGE-transmit function. It is described therein that the power efficiency is a key market issue for mobile phones, and the polar loop system offers the advantage that an RF power amplifier working nearly in saturation achieves good power efficiency. Also, it is described that an additional advantage arises from the action of the RF power amplifier in saturation due to the polar loop system having a low-noise characteristic.

In addition, Non-patent Document 2, which is to be cited later, describes a polar modulation transmitter for GMSK in GSM and 8PSK in EDGE, in which the power control for ramping and modulation is conducted by controlling the collector source voltage. The implementation of AM modulation is achieved by a system very similar to that of a high-current CMOSLDO. According to a system very similar to that of such CMOSLDO, an AM control input signal is supplied to an inverting input terminal of a differential amplifier, an output signal of the differential amplifier is supplied to a gate of a P-channel MOS transistor, and a drain output of the P-channel MOS transistor is supplied to a non-inverting input terminal of the differential amplifier through a resistance-division-type negative feedback circuit. A drain output signal of the P-channel MOS transistor, which is proportional to the AM control input signal, is supplied to an RF power amplifier as a collector source voltage. Now, LDO refers to a series regulator of low dropout (output low voltage drop) as described in Non-patent Document 3, which is to be cited later.

Further, Non-patent Document 2 describes a special bias calibration technique for adjusting an input base bias of the RF power amplifier. For this purpose, a current-sensing circuit without any in-line ohmic loss leading to the deterioration in system efficiency is used. This current-sensing circuit includes: a simple current mirror having a large-size P-channel MOS transistor and a small-size P-channel MOS transistor connected in parallel for supplying a collector source voltage to the RF power amplifier; a differential amplifier; an N-channel MOS transistor; and a sensing resistance. A sense current at the small-size P-channel MOS transistor is converted into a sense voltage across the sensing resistance, and the sense voltage is amplified by a voltage amplifier. The amplified output of the voltage amplifier is compared with a bias reference value by another differential amplifier, and a comparison-output signal from the differential amplifier is supplied as a base bias for the RF power amplifier through a sample hold circuit.

On the other hand, Non-patent Document 3, which is to be cited later, describes a regulator of low dropout (output low voltage drop) including a protection circuit against an excessively large output current owing to the short circuit of a load, etc. The regulator includes a bandgap-reference-voltage generator, a first control loop of a voltage follower, and a second control loop for sensing an output current. The sensing resistance of the second control loop serves to convert the sense current proportional to the output current into a sense voltage. The sense voltage is compared with a reference voltage by a comparator. When the sense voltage is higher than the reference voltage, the transistor controlled by an output from the comparator shunts an input of an output circuit of the voltage follower. As a result, the regulator has a current-limit property of 5.3 amperes when outputting approximately 1.2 volts.

In addition, Patent Document 1, which is to be specified later, describes a restriction in the increase of the output current of a source-voltage-controlling regulator owing to the decrease in load impedance of the RF power amplifier controlled in the collector source voltage as described in Non-patent Document 2. For this purpose, a current limit circuit is connected to the source-voltage-controlling regulator. The current limit circuit includes: a small-size P-channel MOS transistor; a differential amplifier; a P-channel control MOS transistor; a reference-current source; an N-channel MOS transistor; and a P-channel MOS current mirror. The small-size P-channel MOS transistor of the current limit circuit is connected in parallel with a large-size P-channel MOS transistor of a regulator which supplies a collector source voltage to an RF power amplifier.

The sense current at the small-size transistor, which is proportional to the regulator output current pas sing through the large-size transistor, is supplied to the reference-current source and the gate of the N-channel MOS transistor through the source-drain path of the P-channel control MOS transistor controlled according to the output from the differential amplifier.

The lowering in the load impedance of the RF power amplifier increases the output current of the regulator and increases the sense current than the reference current of the reference-current source. Then, the N-channel MOS transistor is turned on, and the output current of the P-channel MOS current mirror pulls up the gates of both the large-size and small-size P-channel MOS transistors.

As a result, the output current from the regulator and the sense current decrease until the sense current conforms to the reference current. Thus, the current limit circuit connected with the source-voltage-controlling regulator of the RF power amplifier can restrict the maximum value of the collector current of the RF power amplifier to about 1.9 amperes.

Non-patent Document 1: Earl McCune, "High-Efficiency, Multi-Mode, Multi-Band Terminal Power Amplifiers", IEEE microwave magazine, March 2005, PP. 44-55.

Non-patent Document 2: David R. Pehlke et al, "High Performnce Open-Loop AM Modulator Designed for Power Control of an E-GPRS Polar Modulated Power Amplifier", IEEE 2004 CUSTOM INTEGRATED CIRCUITS CONFERENCE, PP. 569-572.

Non-patent Document 3: Oscar Moreira-Tamayo, "A High Current Low Dropout Regulator With Dual Output Stage and Dual Control Loop", 2005 48th Midwest Symposium on Circuits and Systems, 7-10 Aug. 2005, PP. 992-995.

Patent Document 1: U.S. Pat. No. 7,193,474 B2

SUMMARY OF THE INVENTION

Prior to the invention, the inventors were engaged in development of a polar loop system's RF power module supporting an EDGE-transmit function for a mobile-phone terminal which communicates with a base station.

It has been examined by the inventors to materialize AM modulation of an EDGE system, and ramp-up and ramp-down in a transmit-time slot of a GSM system by using an LDO type regulator to control the source voltage of an RF power amplifier as described in the Non-patent Document 2.

To improve the communication data transfer rate in an EDGE system in comparison to a GMSK system, it is required that the RF power amplifier perform accurate AM modulation. Further, the improvement of the communication data transfer rate in the EDGE system requires the enhancement of performance in the error vector magnitude (EVM) during AM modulation. When a polar modulation transmitter using an LDO type regulator as described in Non-patent Document 2 is adopted, and an AM control input signal is supplied to an inverting input terminal of the differential amplifier of the regulator, the source voltage of the RF power amplifier and an AM modulation amplitude component of the EDGE system can be controlled by the level of the AM control input signal with high accuracy.

As the adjacent channel power ratio (ACPR) is strictly regulated by the standard in a GSM system, it is necessary to control the transition in the transmission power level of the RF power amplifier with high accuracy during the times of ramp-up and ramp-down. Hence, a regulator of the LDO type may be utilized for ramp-up and ramp-down in a transmit-time slot of the GSM system. Specifically, when a ramp-control signal Vramp from a baseband processing unit is supplied to an inverting input terminal of a differential amplifier of an LDO type regulator, ramp-up and ramp-down in a transmit-time slot of the GSM system can be materialized with high accuracy.

Meanwhile, the decrease in load impedance of the RF power amplifier remarkably increases the output current of the collector source-voltage-controlling regulator as described in Patent Document 1. With mobile-phone terminals, the impedance of an antenna is 50Ω in general. A power transistor of the final amplification stage of the RF power amplifier has an output impedance of several ohms even though it is a power bipolar transistor or a power MOS transistor.

Therefore, as to an RF power amplifier, an output impedance matching circuit is connected between a power transistor of the final amplification stage of the RF power amplifier and an antenna in general. For example, such output impedance matching circuits include an inductor and a capacitor. In this case, in a Smith chart for analyzing the condition of impedance match, the start point is at the output impedance of the power transistor of the final amplification stage (several ohms), ant the impedance moves to a first destination point drawing a clockwise locus along a constant-resistance circle because of the reactance of the inductor of the output impedance matching circuit. Finally, the impedance moves from the first destination point to the impedance of the antenna (50Ω), whose value is expressed by 1+j·0 when normalized at 50Ω on a straight line of the axis of resistance, while drawing a clockwise locus because of the capacitance of the capacitor of the output impedance matching circuit. Thus, using the output impedance matching circuit when the antenna has an impedance of 50Ω, enables the materialization of the impedance match between the low output impedance of the power transistor of the final amplification stage and the high input impedance of the antenna.

However, when a user touches the antenna of a mobile-phone terminal with his or her hand by mistake or the antenna is brought into contact with a piece of metal (e.g. a metallic chassis of a notebook-sized PC), the mobile-phone terminal goes into a temporary impedance mismatch condition, and thus the input impedance of the antenna plummets temporarily, and the output current of the RF power amplifier increases remarkably. At that time, the current limit circuit connected with the source-voltage-controlling regulator of the RF power amplifier as described in Patent Document 1 can restrict the maximum value of the output current of the RF power amplifier to a predetermined limit current value effectively. Thus, the drain of a battery of a mobile-phone terminal and the damage to the regulator of the RF power amplifier can be avoided by the current limit circuit. When such temporary impedance mismatch condition is eliminated and the output current of the RF power amplifier is turned back into its normal condition, the current-limiting action of the current limit circuit is stopped, and the RF power amplifier and the source-voltage-controlling regulator can return back to their normal actions.

However, it was found in the course of the development of an RF power module by the inventors prior to the invention that adopting the current-limiting method for the RF power amplifier's source-voltage-controlling regulator as described above poses the following problem.

That is when such a temporary impedance mismatch condition is maintained for a long time, the current limit circuit keeps a limit current of about 1.9 amperes passing through the RF power amplifier, and thus a battery of the mobile-phone terminal is drained. Also, there is a potential for the resultant heat generation to cause the breakdown of other parts of the RF power module.

Another problem is one which comes from the breakdown of a mobile-phone terminal. It is conceivable e.g. a breakdown such that inside an RF power module mounted on a mobile-phone terminal, a collector or drain output of the power transistor of the final amplification stage of an RF power amplifier is short-circuited with the emitter or source terminal. In addition, it is conceivable a breakdown such that a terminal short circuit between portions as described above occurs in the internal wiring of the motherboard of a mobile-phone terminal equipped with the RF power module. Particularly, a mobile-phone terminal of a GSM system has a maximum transmission power as high as about 4 watts, and works with a large current, in which the maximum output current of the power transistor of the final amplification stage of an RF power amplifier is close to 2 amperes.

Therefore, it cannot be denied that a terminal short circuit of the portions as described above occurs inside the RF power module or on the internal wiring of the motherboard with some probability of breakdown during the use over a long term. Even when such trouble occurs, the current limit circuit connected with the source-voltage-controlling regulator of the RF power amplifier as described above will continue passing an operating current through the RF power amplifier through the regulator from the battery of the mobile-phone terminal while keeping a predetermined limit current value, and thus the battery will be discharged excessively.

As the battery of a mobile-phone terminal, a lithium-ion battery pack is used in general. The battery pack includes, in addition to a lithium-ion battery cell, a battery protection IC which monitors and controls overcharge and over-discharge, and a MOSFET serving as a circuit-cutoff switch under an abnormal condition. Therefore, when a battery pack goes into an over-discharge condition, the battery protection IC turns off the MOSFET serving as a circuit-cutoff switch, whereby further drain of the battery and the accident of catching fire can be obviated. However, when the lithium-ion battery pack goes into a circuit-cutoff condition, the total system of the mobile-phone terminal goes down except that the battery protection IC keeps the MOSFET serving as a circuit-cutoff switch in OFF state.

Therefore, not only the RF power amplifier, RF analog integrated circuit, baseband processing unit and others, but also the application processing unit which controls the liquid crystal display unit and monitors the actuation by a user on the mobile-phone terminal's power switch, numeric keys and the like stop working. Hence, in the situation where the application processing unit has stopped operating, it becomes impossible for a user to restart the action of the mobile-phone terminal, and the user has nothing else to do but ask a service station such as an appliance dealer to repair the out-of-order mobile-phone terminal.

Thus, it was found that there is the problem that when the current-limiting method is adopted for the source-voltage-controlling regulator of an RF power amplifier like this, the breakdown of the RF power amplifier would trigger the total system failure of the mobile-phone terminal, which the user cannot cope with.

Also, it was found that there is the problem that in the current limit circuit as described in Patent Document 1, the value of a limit current which restricts the maximum output current of the RF power amplifier is influenced by the variation in the gate threshold voltage of NMOS transistor driven by the difference current between the sense current Isen and the reference current and the variation in the pair ratio of the PMOS current mirror.

The invention was made as a result of an Examination by the inventors prior to the invention as stated above.

Therefore, it is an object of the invention to reduce the drain of a battery of a mobile-phone terminal even when the impedance mismatch condition lasts for a long time.

Also, it is another object of the invention to provide a current-protection method for a source-voltage-controlling regulator of an RF power amplifier, such that the breakdown of the RF power amplifier never triggers the total system failure of the mobile-phone terminal.

Likewise, it is still another object of the invention to provide the current-protection method by which the variations have a small influence.

The above and other objects and novel features hereof will be apparent from the description hereof and the accompanying drawings.

Of an Embodiments of the invention herein disclosed, the preferred ones will be described below briefly.

A preferred RF power amplifier apparatus of the invention includes an RF power amplifier (RFPA) and a power-supply circuit (Pwr_Cnt) (see FIG. 1).

The power-supply circuit controls the level of a source voltage ($V_{LDO}$) supplied to an RF power amplifier in response to the level of a power-control signal (Vapc).

The power-supply circuit includes a source-current-sensing circuit which produces a sense signal (Vsen) corresponding to a source current ($I_{LDO}$) with respect to the source voltage. The power-supply circuit includes a current-control unit (Cmp1, Cmp2, FF1, NAND3 and Qp4) for controlling the level of the source current ($I_{LDO}$) in response to the level of the sense signal (Vsen).

The current-control unit responds to coincidence of the level of the sense signal (Vsen) with an allowable sense signal level (Vsh) corresponding to source current's allowable level ($I_{LDO}$(Max)), and controls the source current ($I_{LDO}$) to a limit current set to be smaller than the allowable level ($I_{LDO}$(Max)).

DETAILED DESCRIPTION OF THE PREFERRED EMBODIMENTS

1. Summary of the preferred embodiments

Figure 1:
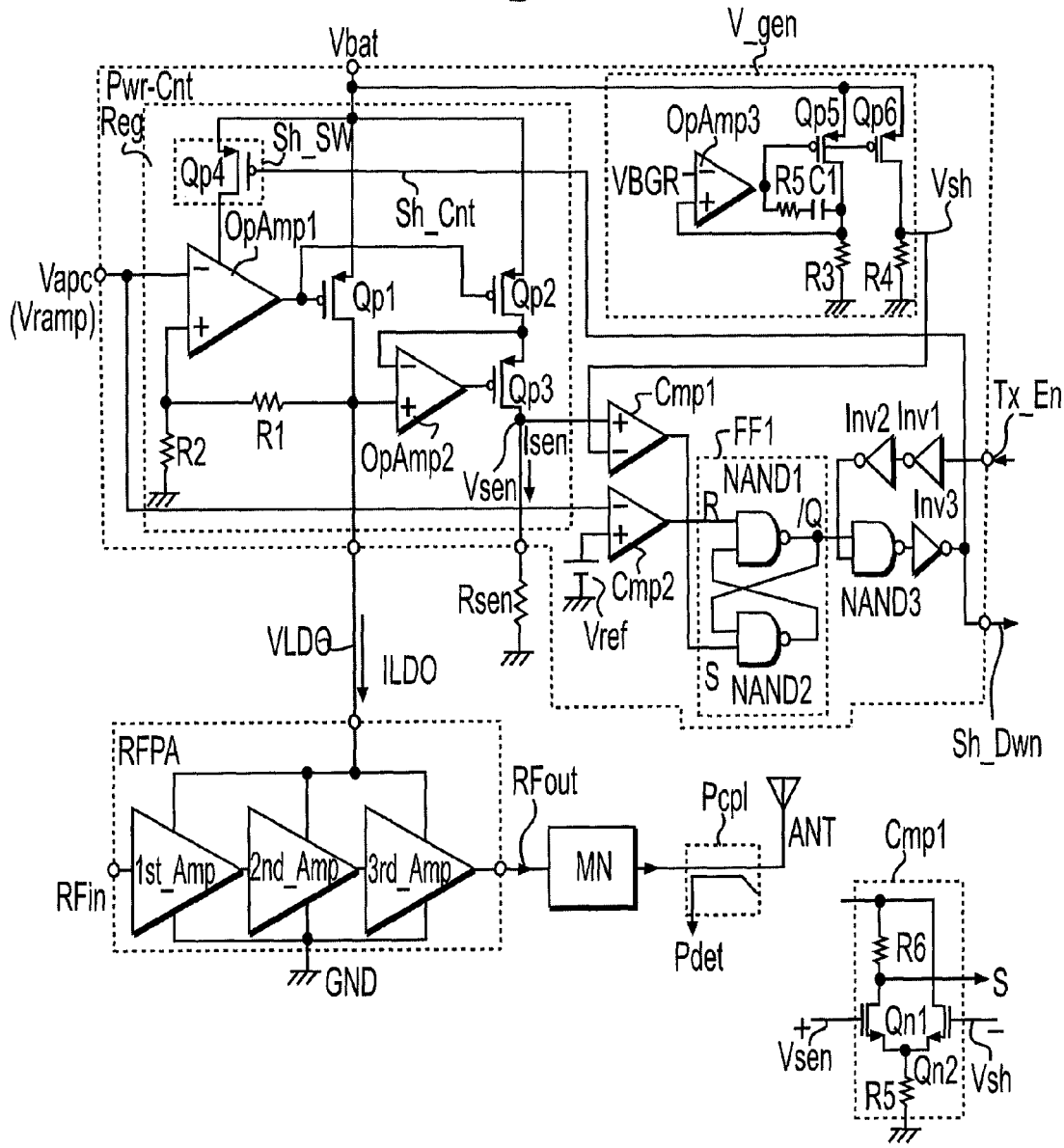
FIG. 1 is a diagram showing a configuration of an RF power module included in a polar loop transmitter materializing an EDGE-transmit function for a mobile-phone terminal operable to communicate with a base station according to an embodiment.

First, the preferred embodiments of the invention hereby disclosed will be described in outline. In the description of the Summary of the preferred embodiments, the reference numerals and characters of the drawings to refer to the drawings, which are accompanied with paired round brackets, only exemplify what the concepts of constituents referred to by the numerals and characters contain.

[1] An RF power amplifier apparatus according to a preferred embodiment of the invention includes an RF power amplifier (RFPA) and a power-supply circuit (Pwr_Cnt) (see FIG. 1).

The power-supply circuit (Pwr_Cnt) supplies the RF power amplifier (RFPA) with a source voltage ($V_{LDO}$).

The power-supply circuit is arranged so as to control the level of the source voltage supplied to the RF power amplifier in response to the level of a power-control signal (Vapc).

The power-supply circuit includes a source-current-sensing circuit (Qp2, OPAmp2, Qp3, Rsen) for producing a sense signal (Vsen) corresponding to a source current ($I_{LDO}$) with respect to the source voltage supplied to the RF power amplifier.

The power-supply circuit includes a current-control unit (Cmp1, Cmp2, NAND1, NAND2, NAND3, Inv1, Inv2, Inv3, Qp4) for controlling the level of the source current with respect to the source voltage in response to the level of the sense signal produced by the source-current-sensing circuit.

The current-control unit is arranged so as to respond to the coincidence of the level of the sense signal (Vsen) produced by the source-current-sensing circuit with an allowable sense signal level (Vsh) corresponding to an allowable level ($I_{LDO}$(Max)) of the source current and control the source current to a limit current set to be smaller than the allowable level of the source current.

As to the power-supply circuit according to a preferred embodiment hereof, the current-control unit includes a shutdown switch (Qp4). The shutdown switch of the current-control unit is controlled into its OFF state in response to coincidence of the level of the sense signal produced by the source-current-sensing circuit with the allowable sense signal level. The limit current is a shutdown current when the shutdown switch of the current-control unit is in the OFF state.

According to the above preferred embodiment, even when the impedance mismatch condition lasts for a long time, the drain of a battery of a mobile-phone terminal can be reduced.

In a more preferred embodiment, the current-control unit includes a latch (FF1, NAND1, NAND2).

The RF power amplifier executes an action of transmission of a transmit-time slot of a GSM system.

The power-control signal (Vapc) supplied to the power-supply circuit makes a ramp-control voltage (Vramp) for ramp-up and ramp-down in a transmit-time slot of a GSM system.

The RF power amplifier apparatus is arranged so that the latch of the current-control unit is set into one state in the ramp-up according to the ramp-control voltage, whereby the power-supply circuit automatically supplies the RF power amplifier with the source voltage ($V_{LDO}$) and the source current ($I_{LDO}$).

When the latch of the current-control unit is set into another state differing from the one state in response to coincidence of the level of the sense signal produced by the source-current-sensing circuit with the allowable sense signal level, the latch of the current-control unit controls the shutdown switch into the OFF state.

Further, in a preferred embodiment, the power-control signal (Vapc) makes an AM control input signal of an EDGE system.

Also, the RF power amplifier executes an action of transmission of a transmit-time slot of an EDGE system.

Figure 9:
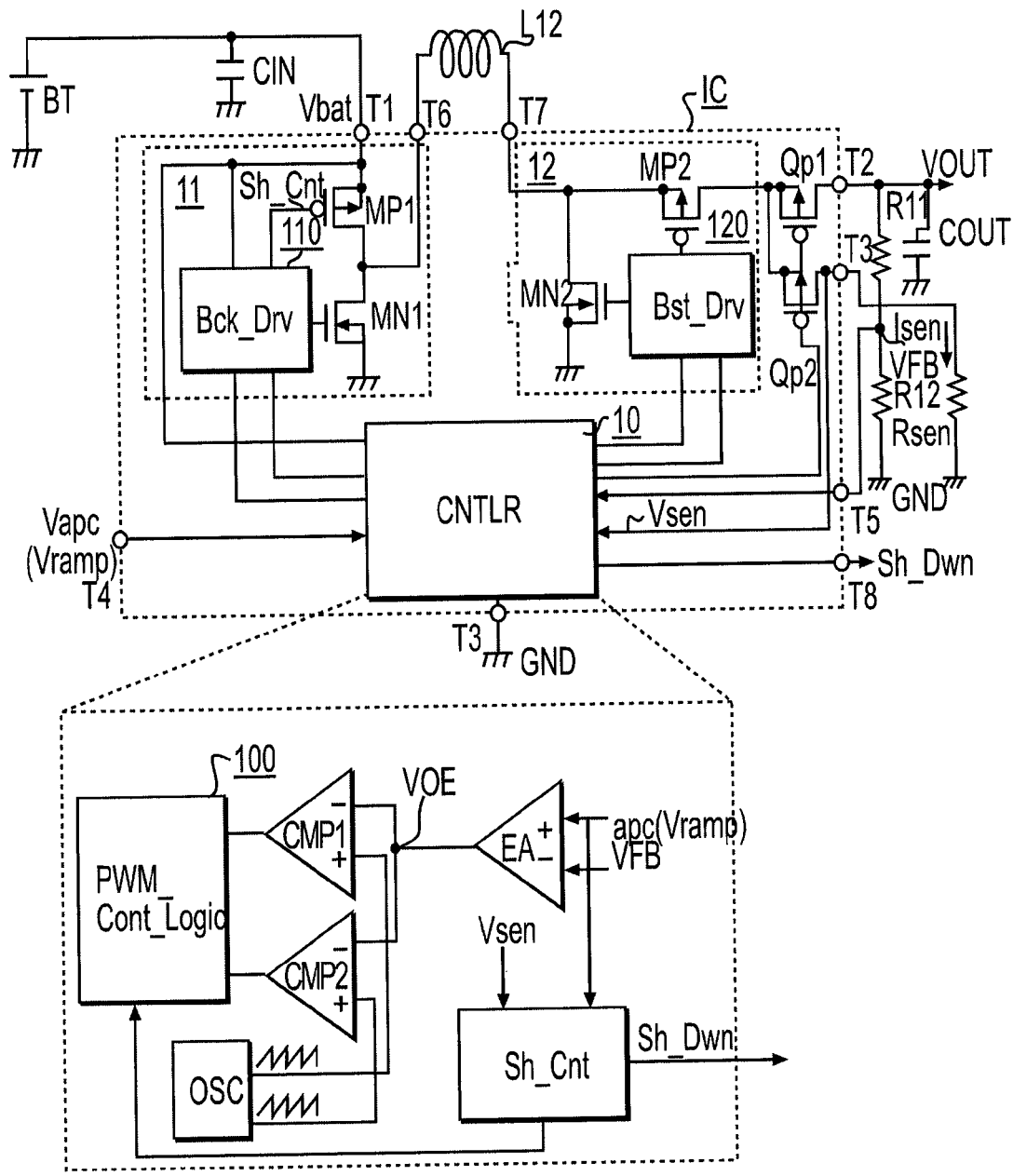
FIG. 9 is a diagram showing a configuration of an integrated DC-DC converter according to another embodiment of the invention, which is mounted on an RF power amplifier module of a GSM-EDGE transmission system.

In still another preferred embodiment, the power-supply circuit includes at least one of a series regulator and a switching regulator (see FIGS. 1 and 9).

Also, in another preferred embodiment, the power-supply unit includes a first P-channel MOS transistor (Qp1), and the first P-channel MOS transistor supplies the source voltage and the source current to the RF power amplifier.

The source-current-sensing circuit includes: a differential amplifier (OpAmp2); a second P-channel MOS transistor (Qp2); a third P-channel MOS transistor (Qp3); and a sensing resistance (Rsen).

The source and gate of the second P-channel MOS transistor are connected with the source and gate of the first P-channel MOS transistor, respectively.

The non-inverting input terminal (+) of the differential amplifier is connected with the drain of the first P-channel MOS transistor. The inverting input terminal (−) of the differential amplifier is connected with the drain of the second P-channel MOS transistor and the source of the third P-channel MOS transistor.

The gate of the third P-channel MOS transistor is connected with the output terminal of the differential amplifier. Through the drain of the third P-channel MOS transistor, a sense current proportional to the source current is supplied to the sensing resistance. As the sense signal, a sense voltage is developed across the sensing resistance (see FIG. 1).

Figure 3:
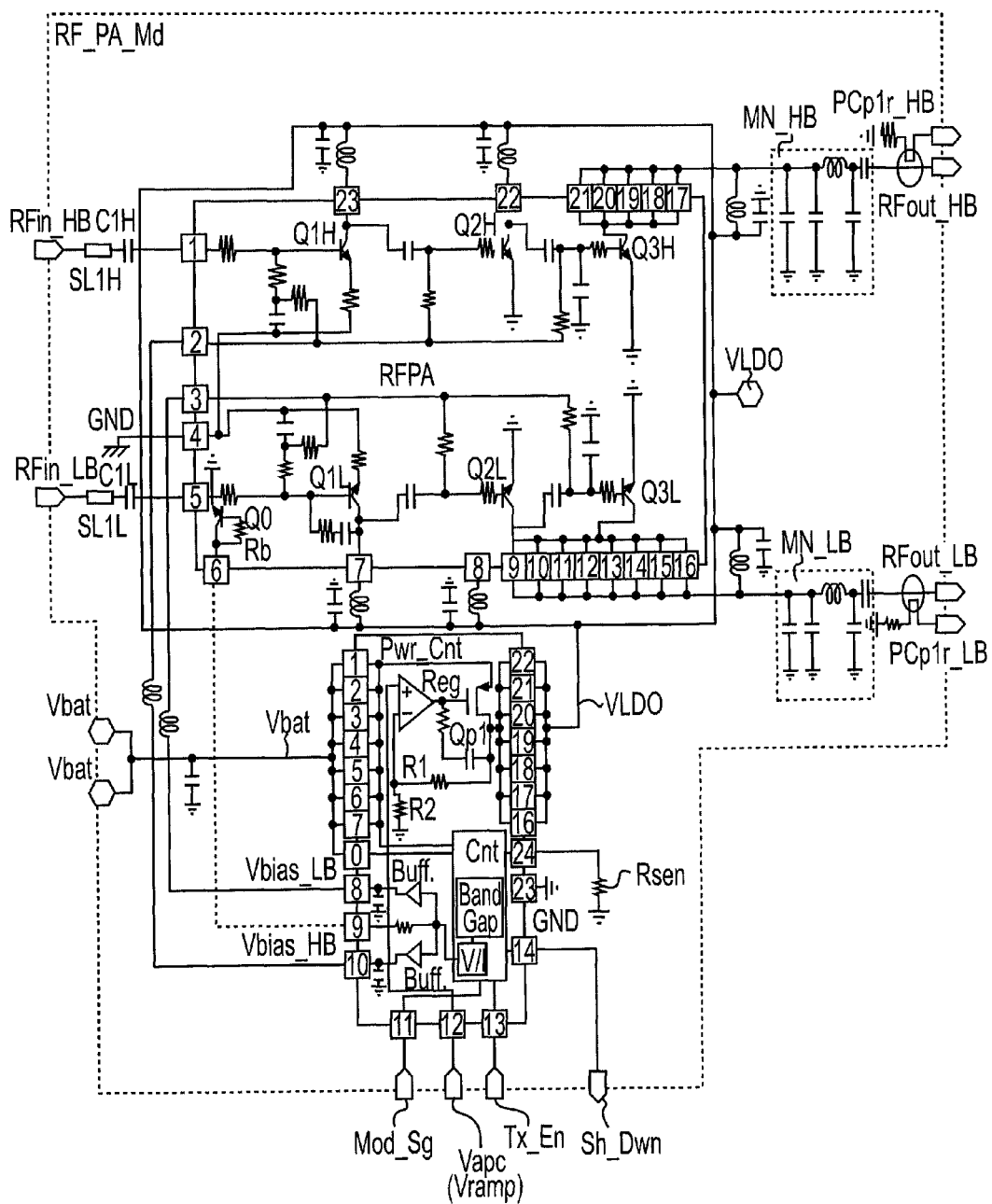
FIG. 3 is a diagram showing a configuration of an RF power module including a polar loop transmitter materializing an EDGE-transmit function for a mobile-phone terminal according to a specific embodiment of the invention, provided that the mobile-phone terminal conducts multiband communication with a base station.

In a specific embodiment, the power-supply circuit and the RF power amplifier are formed inside the package of an RF power module (see FIG. 3).

In a more specific embodiment, the current-control unit includes a voltage comparator (Cmp1) for sensing that the level of the sense signal (Vsen) is coincident with the allowable sense signal level (Vsh) (see FIG. 1).

[2] A power-supply circuit (Pwr_Cnt) according to a preferred embodiment from another aspect of the invention supplies an RF power amplifier (RFPA) with a source voltage ($V_{LDO}$).

The power-supply circuit is arranged so as to control the level of the source voltage supplied to the RF power amplifier in response to the level of a power-control signal (Vapc) (see FIG. 1).

The power-supply circuit includes a source-current-sensing circuit (Qp2, OpAmp2, Qp3, Rsen) which produces a sense signal (Vsen) corresponding to a source current ($I_{LDO}$) with respect to the source voltage supplied to the RF power amplifier.

The power-supply circuit includes a current-control unit (Cmp1, Cmp2, NAND1, NAND2, NAND3, Inv1, Inv2, Inv3, Qp4) for controlling the level of the source current with respect to the source voltage in response to the level of the sense signal produced by the source-current-sensing circuit.

The current-control unit is arranged so as to respond to coincidence of the level of the sense signal (Vsen) produced by the source-current-sensing circuit with an allowable sense signal level (Vsh) corresponding to an allowable level ($I_{LDO}$ (Max)) of the source current and control the source current to a limit current set to be smaller than the allowable level of the source current.

As to the power-supply circuit according to a preferred embodiment hereof, the current-control unit includes a shutdown switch (Qp4). The shutdown switch of the current-control unit is controlled into its OFF state in response to coincidence of the level of the sense signal produced by the source-current-sensing circuit with the allowable sense signal level. The limit current is a shutdown current when the shutdown switch of the current-control unit is in the OFF state.

In a more preferred embodiment, the current-control unit includes the latch (FF1, NAND1, NAND2).

The RF power amplifier executes an action of transmission of a transmit-time slot of a GSM system.

The power-control signal (Vapc) supplied to the power-supply circuit makes a ramp-control voltage (Vramp) for ramp-up and ramp-down in a transmit-time slot of a GSM system.

The RF power module is arranged so that the latch of the current-control unit is set into one state in the ramp-up according to the ramp-control voltage, whereby the power-supply circuit automatically supplies the RF power amplifier with the source voltage ($V_{LDO}$) and the source current ($I_{LDO}$).

When the latch of the current-control unit is set into another state differing from the one state in response to coincidence of the level of the sense signal produced by the source-current-sensing circuit with the allowable sense signal level, the latch of the current-control unit controls the shutdown switch into the OFF state.

Further, in a preferred embodiment, the power-control signal (Vapc) makes an AM control input signal of an EDGE system.

Also, the RF power amplifier executes an action of transmission of a transmit-time slot of an EDGE system.

In still another preferred embodiment, the power-supply circuit includes at least one of a series regulator and a switching regulator (see FIGS. 1 and 9).

Also, in another preferred embodiment, the power-supply unit includes a first P-channel MOS transistor (Qp1), and the first P-channel MOS transistor supplies the source voltage and the source current to the RF power amplifier.

The source-current-sensing circuit includes: a differential amplifier (OpAmp2); a second P-channel MOS transistor (Qp2); a third P-channel MOS transistor (Qp3); and a sensing resistance (Rsen).

The source and gate of the second P-channel MOS transistor are connected with the source and gate of the first P-channel MOS transistor, respectively.

The non-inverting input terminal (+) of the differential amplifier is connected with the drain of the first P-channel MOS transistor. The inverting input terminal (−) of the differential amplifier is connected with the drain of the second P-channel MOS transistor and the source of the third P-channel MOS transistor.

The gate of the third P-channel MOS transistor is connected with the output terminal of the differential amplifier. Through the drain of the third P-channel MOS transistor, a sense current proportional to the source current is supplied to the sensing resistance. As the sense signal, a sense voltage is developed across the sensing resistance (see FIG. 1).

In a specific embodiment, the power-supply circuit and the RF power amplifier are formed inside the package of an RF power module (see FIG. 3).

In a more specific embodiment, the current-control unit includes a voltage comparator (Cmp1) for sensing that the level of the sense signal (Vsen) is coincident with the allowable sense signal level (Vsh) (see FIG. 1).

Next, a more detailed descriptions of the embodiments are to be presented. The best mode for carrying out the invention will be described below in detail with reference to the drawings. It is noted that in all the drawings for description of the best mode for carrying out the invention, members having identical functions are identified by the same reference numeral or character, and the repeated description is omitted.

<<Polar Loop Transmitter which Materializes EDGE-transmit Function>>

FIG. 1 is a diagram showing a configuration of an RF power module included in a polar loop transmitter materializing an EDGE-transmit function for a mobile-phone terminal operable to communicate with a base station according to an embodiment of the invention.

The polar loop transmitter of FIG. 1 includes: an RF power amplifier RFPA; an output-matching circuit MN; a power-sensing directional coupler Pcpl; an antenna ANT; and a power-control unit Pwr_Cnt.

The RF power amplifier RFPA is formed in the GaAs semiconductor chip of a GaAs-MMIC (Microwave Monolithic Integrated Circuit), and the power-control unit Pwr_Cnt is formed in the silicon semiconductor chip of a CMOS monolithic integrated circuit. The battery voltage Vbat from a battery cell of a lithium-ion battery pack of a mobile phone varies in a voltage range of 3.1 to 4.2 volts; the battery voltage Vbat is supplied to the power-control unit Pwr_Cnt.

To an RF input terminal of the RF power amplifier RFPA, an RF transmit input signal RFin produced by the transmit-signal-processing unit of the RF analog integrated circuit (RFIC) of a mobile-phone terminal is supplied. The RF power amplifier RFPA includes a combination of a first-stage RF amplifier circuit $1^{st}$_Amp, a second-stage RF amplifier circuit $2^{nd}$_Amp and a final-stage RF amplifier circuit $3^{rd}$_Amp connected dependently. An RF transmit amplified output signal RFout at an output terminal of the final-stage RF amplifier circuit $3^{rd}$_Amp is passed through the output-matching circuit MN and the power-sensing directional coupler Pcpl and then supplied to the antenna ANT of the mobile-phone terminal, which has an input impedance of 50Ω.

The output-matching circuit MN performs the impedance matching between a low output impedance of a power transistor (not shown) of the final-stage RF amplifier circuit $3^{rd}$_Amp of the RF power amplifier RFPA (several ohms) and a high input impedance of the antenna ANT (50Ω). A part Pdet of the RF power signal coming from the power-sensing directional coupler Pcpl is detected by e.g. a power-detecting circuit of RFIC (not shown), and the resultant RF power detected output signal is supplied to one input terminal of an error amplifier of RF IC. To the other input terminal of the error amplifier, a ramp-control signal Vramp for ramp-up and ramp-down in a transmit-time slot of a GSM system and an AM control input signal of an EDGE system are supplied from the baseband processing unit (not shown). The automatic power-control signal Vapc, which is an output signal of the error amplifier, makes the AM control input signal in the EDGE system. Also, the automatic power-control signal Vapc makes the ramp-control voltage Vramp for ramp-up and ramp-down in a transmit-time slot in the GSM system.

The LDO type regulator Reg of the power-control unit Pwr_Cnt is supplied with the battery voltage Vbat from the battery of the mobile phone and the automatic power-control signal Vapc (ramp-control voltage Vramp) from the error amplifier of RFIC. The RF power amplifier RFPA is supplied with the collector source voltage $V_{LDO}$ from the LDO type regulator Reg of the power-control unit Pwr_Cnt. The voltage level of the collector source voltage $V_{LDO}$ supplied to the RF power amplifier RFPA is controlled exactly according to the level of the automatic power-control signal Vapc (ramp-control voltage Vramp) supplied to the inverting input terminal (−) of the differential amplifier OpAmp1 of the regulator Reg.

Specifically, the LDO type regulator Reg of the power-control unit Pwr_Cnt includes a first differential amplifier OpAmp1, a large-size P-channel MOS transistor Qp1, and a resistance-division-type negative feedback circuit R1 and R2. Hence, the voltage level of the collector source voltage $V_{LDO}$ supplied to the RF power amplifier RFPA is given by the following expression.

$$V_{LDO}=(R1+R2)\times Vapc/R2 \qquad \text{(Expression 1)}$$

To shut down the LDO type regulator Reg when the source current $I_{LDO}$ supplied to the RF power amplifier RFPA from the LDO type regulator Reg of the power-control unit Pwr_Cnt is made excessively large, the power-control unit Pwr_Cnt includes circuits as follows.

First, the LDO type regulator Reg of the power-control unit Pwr_Cnt includes a sensing circuit for sensing the current level of the source current $I_{LDO}$ toward the RF power amplifier RFPA. The current-level-sensing circuit includes the small-size P-channel MOS transistor Qp2, the second differential amplifier OpAmp2, the P-channel control MOS transistor Qp3, and the sensing resistance Rsen, which is an externally attached discrete part.

The small-size P-channel MOS transistor Qp2 is connected in parallel with the large-size P-channel MOS transistor Qp1 for supplying the RF power amplifier RFPA with the collector source voltage $V_{LDO}$ and the source current $I_{LDO}$. The sense current Isen of the small-size PMOS transistor Qp2 in proportion to the source current $I_{LDO}$ flowing through the large-size PMOS transistor Qp1 is supplied to the sensing resistance Rsen through the source-drain path of the P-channel control MOS transistor Qp3 which is controlled by an output from the second differential amplifier OpAmp2.

The sense current Isen of the small-size PMOS transistor Qp2 is converted into a sense voltage Vsen by the sensing resistance Rsen. The sense voltage Vsen is supplied to the non-inverting input terminal (+) of the comparator Cmp1. To the inverting input terminal (−) of the comparator Cmp1, a shutdown reference voltage Vsh produced by a voltage generator circuit V_gen. In the voltage generator circuit V_gen, a bandgap reference voltage $V_{BGR}$ of about 1.2 volts, which is remarkably small in the dependence on the integrated circuit manufacturing process, the temperature dependence and the source voltage dependence, is supplied to the inverting input terminal (−) of a differential amplifier OpAmp3. Inputs to gates of two P-channel MOS transistors Qp5 and Qp6 are controlled by an output from the differential amplifier OpAmp3. The voltage of the resistance R3 connected to the drain of one PMOS transistor Qp5 is supplied to the non-inverting input terminal (+) of the differential amplifier OpAmp3. Hence, the shutdown reference voltage Vsh, which is stable and proportional to the bandgap reference voltage $V_{BGR}$, is produced at the resister R4 connected with the drain of the other PMOS transistor Qp6, and the shutdown reference voltage Vsh is supplied to the inverting input terminal (−) of the comparator Cmp1. Incidentally, a capacitance C1 and a resistance R5 connected in series for phase compensation are connected between the drain and gate of the one PMOS transistor Qp5. It is noted that a phase-compensation circuit including a capacitance and a resistance connected in series may be connected between the drain and gate of an Each of the other PMOS transistors Qp1, Qp2 and Qp3.

<<Reset of Latch by Ramp-control Voltage>>

Before set into its set state for overcurrent protection, the latch FF1 is first set into a reset state in response to the automatic power-control signal Vapc (ramp-control voltage Vramp) by a reset-control circuit, which is to be described below. The reset-control circuit is the comparator Cmp2 having an inverting input terminal (−) supplied with the automatic power-control signal Vapc (ramp-control voltage Vramp), and a non-inverting input terminal (+) supplied with a reference voltage Vref.

Figure 10:
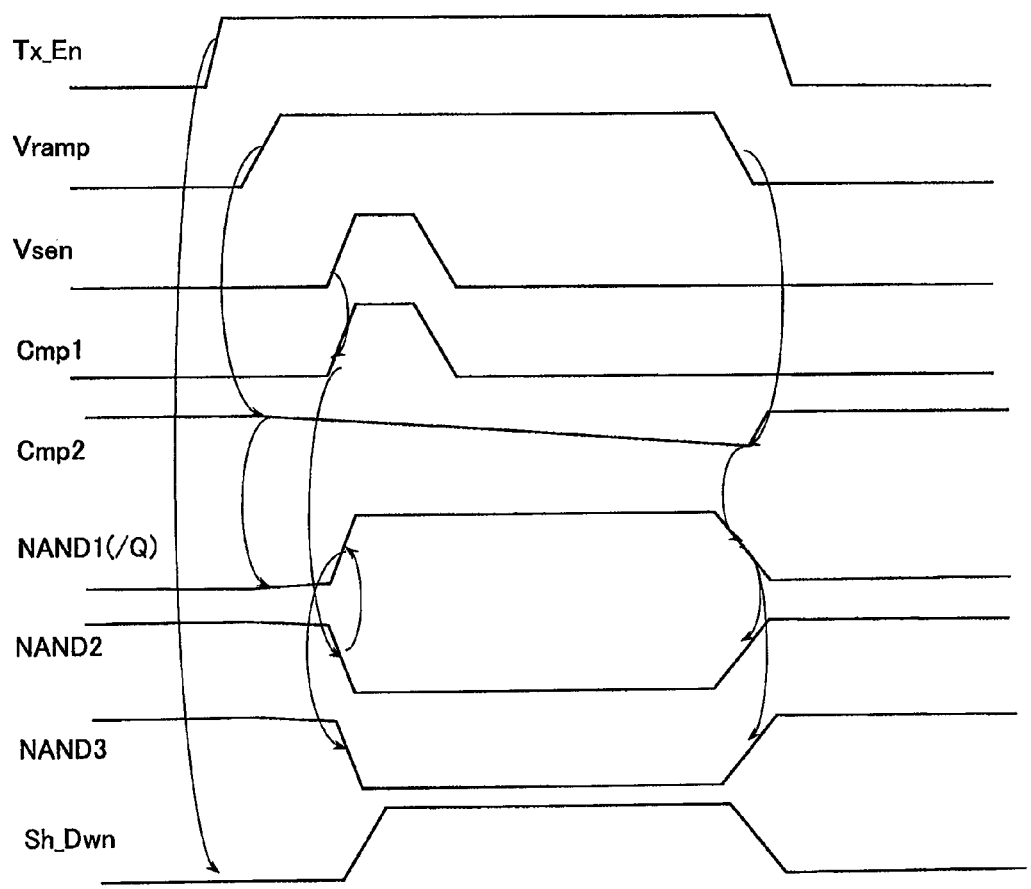
FIG. 10 is a diagram showing waveforms of a transmit enable signal, a ramp-control voltage, a sense voltage, and outputs of comparators, NAND circuits and an inverter in the power-control unit shown in FIG. 1.

FIG. 10 is a diagram showing waveforms of a transmit enable signal Tx_En, the ramp-control voltage Vramp, the sense voltage Vsen, and outputs of the comparators Cmp1 and Cmp2, NAND circuits NAND1, NAND2 and NAND3, and inverter Inv3 in the power-control unit Pwr_Cnt shown in FIG. 1.

Before elapse of a predetermined time early in a ramp-up in a transmit-time slot of a GSM system, the ramp-control voltage Vramp at the inverting input terminal (−) is lower in level than the reference voltage Vref at the non-inverting input terminal (+). Therefore, the output from the comparator Cmp2 is at High level "1", as shown in FIG. 10, and the latch FF1 is brought into the reset state. Specifically, the output signal /Q of the NAND circuit NAND1 is turned to Low level "0", and the output of the NAND circuit NAND2 is turned to High level "1", and the output of the NAND circuit NAND3 is also turned to High level "1". As a result, the shutdown output signal Sh_Dwn at an output of the inverter Inv3 having an input connected with the output of the NAND circuit NAND3 is made Low level "0".

After that, the transmit enable signal Tx_En is changed from Low level "0" to High level "1" and then the ramp-control voltage Vramp is made higher in level than the reference voltage Vref after an elapse of a predetermined time. Hence, the output of the comparator Cmp2 serving as the reset-control circuit varies from High level "1" toward Low level "0" after the elapse of the time as shown in FIG. 10. The driving power of the comparator Cmp2 when the output thereof changes from the High level to the Low level is set to be small. Consequently, the change of the output signal /Q of the NAND circuit NAND1 from Low level "0" to High level "1" is small, provided that an input to the NAND circuit NAND1 is driven by the output of the comparator Cmp2. Therefore, the changes of the output of the NAND circuit NAND2 and the output of the NAND circuit NAND3 from High level "1" to Low level "0" are also small.

In this way, the reset state of the latch FF1 including the NAND circuits NAND1, NAND2 and NAND3, and the inverter Inv 3 is maintained before and after elapse of a predetermined time early in a ramp-up. Therefore, as shown in FIG. 10, the shutdown output signal Sh_Dwn at the output of the inverter Inv3 connected with the output of the NAND circuit NAND3 is at Low level "0", and the P-channel MOS transistor Qp4, which is the shutdown switch Sh_Sw, is controlled to be in its ON state. Thus, the battery voltage Vbat from the battery of the mobile phone can be supplied to the whole RF power amplifier RFPA through the LDO type regulator Reg of the power-control unit Pwr_Cnt.

Latterly in a ramp-down in a transmit-time slot of a GSM system, the ramp-control voltage Vramp at the inverting input terminal (−) is made lower in level than the reference voltage Vref at the non-inverting input terminal (+). Therefore, as shown in FIG. 10, the output of the comparator Cmp2 is made High level "1", the latch FF1 is in the reset state, the output signal /Q of the NAND circuit NAND1 is at Low level "0", the outputs of the NAND circuits NAND2 and NAND3 are made High level "1", and the shutdown output signal Sh_Dwn is made Low level "0".

<<Setting of the Latch by Excessive Source Current>>

Now, for example when the impedance of the antenna ANT lowers, or a short circuit trouble occurs in the power transistor of the final amplification stage of the RF power amplifier, the source current $I_{LDO}$ from the LDO type regulator Reg of the power-control unit Pwr_Cnt to the RF power amplifier RFPA is made excessively large.

Then, the sense voltage Vsen of the sensing resistance Rsen supplied to the non-inverting input terminal (+) of the comparator Cmp1 is made higher in level than the shutdown reference voltage Vsh supplied to the inverting input terminal (−). Accordingly, as shown in FIG. 10, the output of the comparator Cmp1 connected with the setting-input terminal S of the latch FF1 is turned from Low level "0" to High level "1", and the output of the NAND circuit NAND2 is turned from High level "1" to Low level "0". Thus, the output signal /Q of the NAND circuit NAND1 is turned from Low level "0" to High level "1", and the latch FF1 is changed from the reset state to the set state, as shown in FIG. 10.

As a result, the output of the NAND circuit NAND3, to which the output signal /Q of the latch FF1 is coupled, is changed from Low level "0" to High level "1", and therefore the shutdown output signal Sh_Dwn at the output of the inverter Inv3 with its input connected to the output of the NAND circuit NAND3 is changed from Low level "0" to High level "1". Thus, the P-channel MOS transistor Qp4 as the shutdown switch Sh_Sw is controlled from ON state into OFF state. As a result, the whole LDO type regulator Reg of the power-control unit Pwr_Cnt is controlled into its shutdown condition, and the source current $I_{LDO}$ to the RF power amplifier RFPA is also cut off. In this way, the drain of the battery of a mobile-phone terminal can be reduced even when the impedance mismatch condition lasts for a long time in the output-matching circuit MN.

Thus, the P-channel MOS transistor Qp4 of the shutdown switch Sh_Sw is controlled into OFF state, and the whole regulator Reg of the power-control unit Pwr_Cnt is controlled into the shutdown condition, while the shutdown output signal Sh_Dwn of the output of the inverter Inv3 is kept at High level "1".

In a preferred embodiment, during the period of the overcurrent-cutoff-protecting action, the shutdown output signal Sh_Dwn of High level "1" is supplied to at least one of the baseband processing unit and the application processing unit. Consequently, a user can recognize from a warning display by a liquid crystal display unit of the mobile-phone terminal that the overcurrent-cutoff-protecting action is in execution. In the case where the warning display has been displayed by the liquid crystal display unit over a very long time, the user can ask a service station to repair the mobile-phone terminal out of order before the terminal goes into the total system failure.

<<Detail of Current-level-Sensing Circuit>>

In the current-level-sensing circuit, the small-size P-channel MOS transistor Qp2 is connected in parallel with the large-size P-channel MOS transistor Qp1 which supplies the collector source voltage $V_{LDO}$ and source current $I_{LDO}$ to the RF power amplifier RFPA. The second differential amplifier OpAmp2 has: a non-inverting input terminal (+) connected with the drain of the large-size PMOS transistor Qp1; an inverting input terminal (−) connected with the drain of the small-size PMOS Qp2 and the source of the P-channel control MOS Qp3; and an output terminal connected with the gate of the P-channel control MOS Qp3.

Therefore, the second differential amplifier OpAmp2 and the P-channel control MOS Qp3 constitute a voltage follower; the voltage follower copies the drain voltage of the large-size PMOS transistor Qp1 to the drain of the small-size PMOS Qp2. Hence, the source-drain voltage of the small-size PMOS Qp2 can be substantially equal to the source-drain voltage of the large-size PMOS transistor Qp1. Thus, the sense current Isen of the small-size PMOS transistor Qp2 exactly proportional to the source current $I_{LDO}$ passing through the large-size PMOS transistor Qp1 can be supplied to the sensing resistance Rsen.

Further, the comparator Cmp1, which makes a comparison between the shutdown reference voltage Vsh at its inverting input terminal (−) and the sense voltage Vsen of the sensing resistance Rsen at the non-inverting input terminal (+), includes a differential transistor pair of N-channel MOS transistors Qn1 and Qn2 as shown in a lower right portion of FIG. 1. As the differential transistor pair of N-channel MOS transistors Qn1 and Qn2 formed in the silicon semiconductor chip of a CMOS monolithic integrated circuit is high in the pair accuracy of the gate threshold voltages, overcurrent protection, where the device variation has a small influence, can be achieved.

As to the current-level-sensing circuit, the sensing resistance Rsen for converting the sense current Isen of the small-size PMOS transistor Qp2 into the sense voltage Vsen does not represent a semiconductor resistance inside the semiconductor chip of the CMOS monolithic integrated circuit of the power-control unit Pwr_Cnt, and it is composed of a resistor part, which is an externally attached discrete part.

As the semiconductor resistance inside the semiconductor chip has a large variation of about ±30%, the post-conversion voltage after current-to-voltage conversion has also a large variation of about ±30%. As a resistor part which is an externally attached discrete part and whose resistor parts' variation is not more than about 5% is available, the sense voltage Vsen resulting from conversion by the sensing resistance Rsen can be also made about 5% or smaller. As a result, the overcurrent-protecting action with small variation can be achieved.

<<Overcurrent-cutoff-protecting Action by the Current-level-sensing Circuit>>

Figure 2:
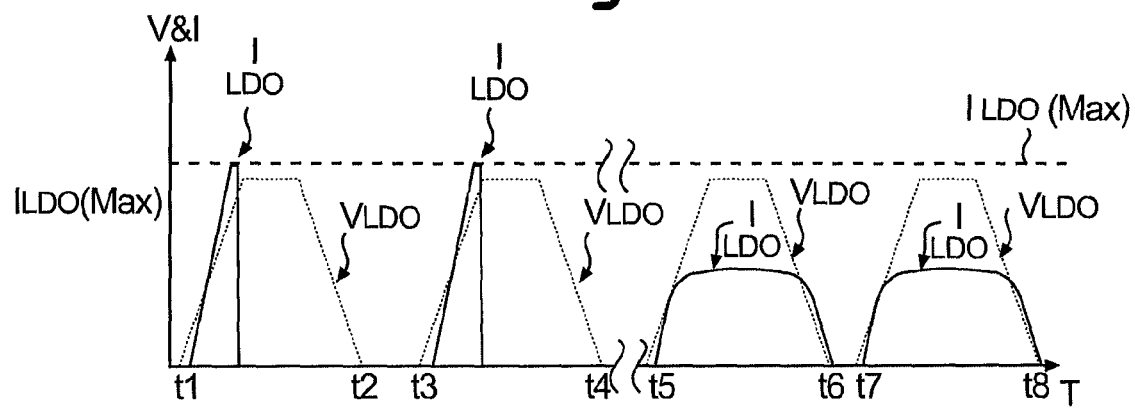
FIG. 2 is a diagram for explaining an overcurrent-cutoff-protecting action by a current-level-sensing circuit of an LDO type regulator of a power-control unit inside the polar loop transmitter according to the embodiment of the invention shown in FIG. 1.

FIG. 2 is a diagram for explaining the overcurrent-cutoff-protecting action by the current-level-sensing circuit of the LDO type regulator Reg of the power-control unit Pwr_Cnt inside the polar loop transmitter according to the embodiment of the invention shown in FIG. 1. The vertical axis of FIG. 2 represents voltage and current, whereas the horizontal axis represents time. The period between the time t1 and time t2 on the horizontal axis of FIG. 2 corresponds to a transmit-time slot of a GSM system. A portion just after the time t1 corresponds to a ramp-up action by the ramp-control voltage Vramp, and a portion just after the time t2 corresponds to a ramp-down by the ramp-control voltage Vramp. Incidentally, the ramp-control voltage Vramp for ramp-up and ramp-down is supplied by the baseband processing unit (not shown) as described in an opening portion hereof.

Figure 6:
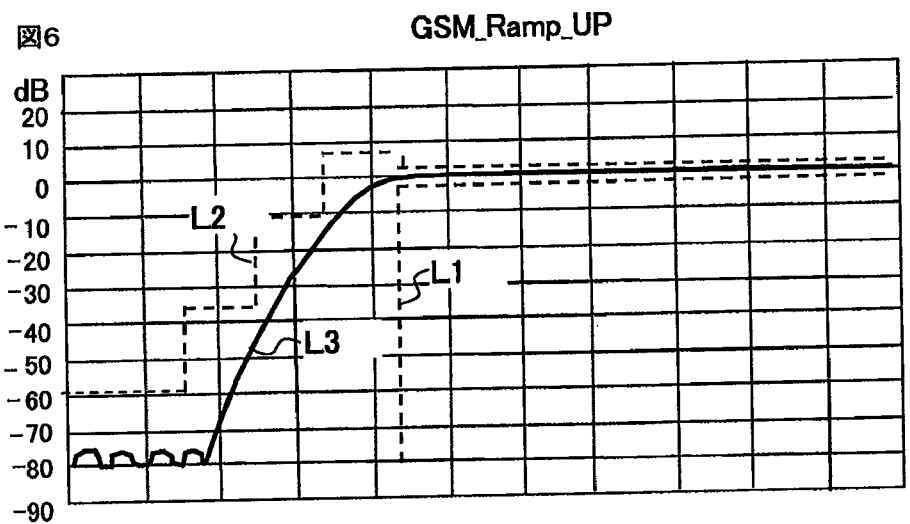
FIG. 6 is a graph showing ramp-up of initial transmission power in a transmit-time slot specified by the GSM standard.
Figure 7:
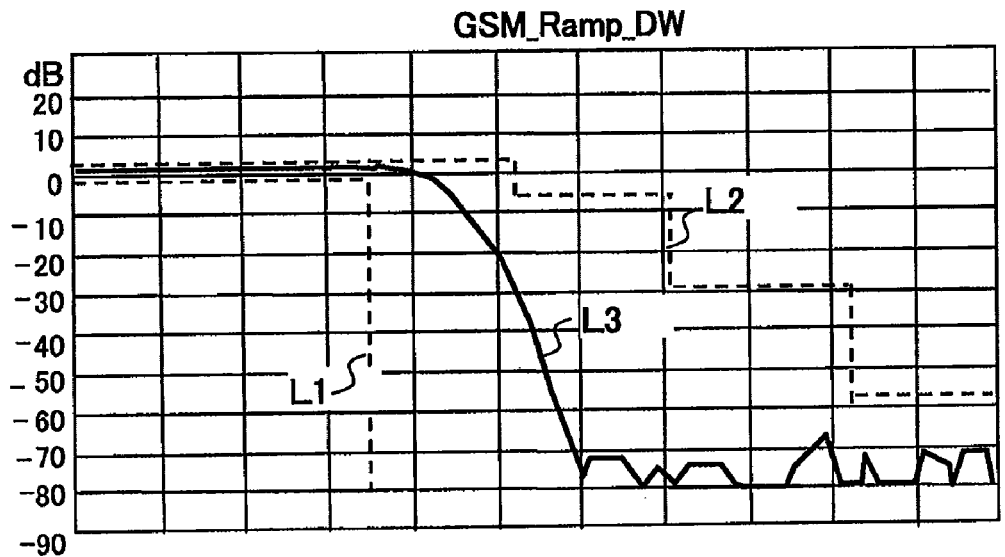
FIG. 7 is a graph showing ramp-down of transmission power in a latter portion of the transmit-time slot designated by the GSM standard.

FIG. 6 is a graph showing ramp-up of initial transmission power in a transmit-time slot designated by the GSM standard. FIG. 7 is a graph showing ramp-down of transmission power in a latter portion of the transmit-time slot designated by the GSM standard. In FIG. 6, it is required that the ramp-up characteristic curve L3 of transmission power be between the broken lines L1 and L2. In FIG. 7, it is required that the ramp-down characteristic curve L3 of transmission power be between the broken lines L1 and L2. When the ramp-up and ramp-down characteristic curves of transmission power do not meet the GSM standard, the frequency spectra of RF transmit signals of a GMSK, which are adopted in GSM, cannot be satisfied. When the prescribed RF transmit signals' frequency spectra cannot be satisfied, it becomes difficult to sufficiently suppress undesired adjacent-channel interference signals' level (ACPR).

Figure 8:
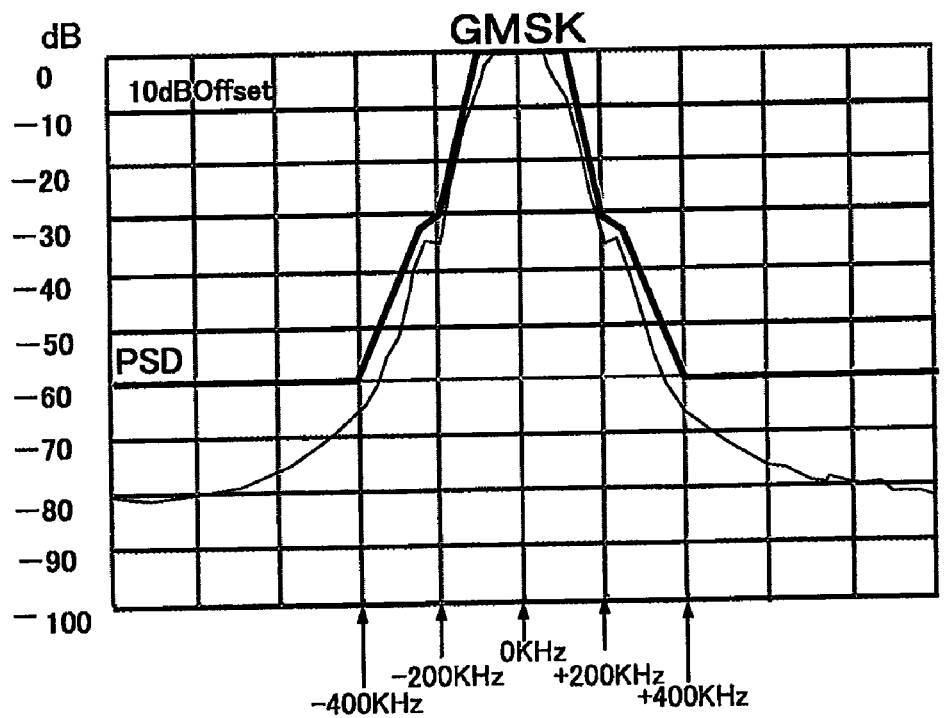
FIG. 8 is a graph showing RF transmit signals' frequency spectra of a mobile-phone-terminal device prescribed by the GMSK standard.

FIG. 8 shows RF transmit signals' frequency spectra of a mobile-phone-terminal device prescribed by the GMSK standard, in which the thick solid line PSD represents the level prescribed by the GMSK standard. The amount of attenuation within ±200 kHz in the vicinity of the central frequency (RF transmit frequency) is specified to be −30 dBm or smaller. The amount of attenuation within ±400 kHz in the vicinity of the central frequency (RF transmit frequency) is specified to be −60 dBm or smaller. The thin solid line shows an example which satisfies the standard.

Referring to FIG. 2 again, the overcurrent-cutoff-protecting action will be described. In a transmit-time slot of a GSM system between the time t1 and time t2 as in FIG. 2, the collector source voltage $V_{LDO}$ supplied from the regulator Reg to the RF power amplifier RFPA is ramped in response to the ramp-control voltage Vramp supplied from the baseband processing unit (not shown). In the case where the lowering in the impedance of the antenna ANT induces an excessively large source current $I_{LDO}$ to the RF power amplifier RFPA from the regulator Reg, which has reached the maximum allowable source current $I_{LDO}$ (Max), the latch FF1 is changed from the reset state into the set state. As a result, the P-channel MOS transistor Qp4 of the shutdown switch Sh_Sw is changed into OFF state. Then, the whole LDO type regulator Reg of the power-control unit Pwr_Cnt is controlled into the shutdown condition, and the source current $I_{LDO}$ to the RF power amplifier RFPA is also cut off. This overcurrent-cutoff-protecting action is continued until the time t2, and the source current $I_{LDO}$ is cut off during much of the transmit-time slot of a GSM system between the time t1 and time t2, and therefore the drain of the battery of the mobile-phone terminal can be reduced.

Also, in the subsequent transmit-time slot of a GSM system between the time t3 and time t4 in FIG. 2, the collector source voltage $V_{LDO}$ supplied to the RF power amplifier RFPA from the regulator Reg is ramped in response to the ramp-control voltage Vramp supplied from the baseband processing unit. Also, at this time, if the impedance of the antenna ANT lowers, the source current $I_{LDO}$ to the RF power amplifier RFPA from the regulator Reg is made excessively large. Then, the source current $I_{LDO}$ reaches the maximum allowable source current $I_{LDO}$ (Max). Consequently, the latch FF1 is changed from the reset state into the set state, and the overcurrent-cutoff-protecting action is executed again. Therefore, the drain of the battery of a mobile-phone terminal can be reduced even when a temporary impedance mismatch condition lasts for a long time in the output-matching circuit MN.

In addition, even when as a worse situation, the failure of short circuit occurs in the power transistor of the final amplification stage of the RF power amplifier, the overcurrent-cutoff-protecting action is executed each time the source voltage $V_{LDO}$ is ramped in the subsequent transmit-time slot of a GSM system and as such, the drain of the battery can be reduced.

Also, in the third transmit-time slot of a GSM system between the time t5 and time t6 in FIG. 2, the collector source voltage $V_{LDO}$ supplied to the RF power amplifier RFPA from the regulator Reg is ramped in response to the ramp-control voltage Vramp supplied from the baseband processing unit.

At this time, the lowering in the impedance of the antenna ANT is canceled, the impedance is recovered to the normal condition 50Ω. Then, the source current $I_{LDO}$ from the regulator Reg to the RF power amplifier RFPA does not become excessively large. Hence, the source current $I_{LDO}$ never reaches the maximum allowable source current $I_{LDO}$ (Max), the latch FF1 is kept in the reset state, and the overcurrent-cutoff-protecting action is not executed. Thus, the RF power amplifier performs normal amplification of an RF transmit output signal RFin. Also, in the fourth transmit-time slot of a GSM system between the time t7 and time t8 in FIG. 2 the antenna ANT has a normal impedance. Therefore, the overcurrent-cutoff-protecting is not executed, and the RF power amplifier conducts the normal amplification.

As described above, even when the source current $I_{LDO}$ from the regulator Reg to the RF power amplifier RFPA is made excessively large, and the latch FF1 is changed from the reset state into the set state, whereby the overcurrent-cutoff-protecting action is executed, the power supply from the regulator Reg to the RF power amplifier RFPA is resumed automatically. This automatic resumption of power supply is executed when the regulator Reg responds to the ramp-control voltage Vramp in a transmit-time slot of a GSM system. A typical protecting action by cutoff as performed by a circuit breaker involves an inconvenience such that a user must resume the action by his or her manual operation. Therefore, the automatically resuming action using the ramp-control voltage Vramp is very useful.

<<Multiband-ready RF Power Module>>

FIG. 3 is a diagram showing a configuration of an RF power module including a polar loop transmitter materializing an EDGE-transmit function for a mobile-phone terminal according to a specific embodiment of the invention, provided that the mobile-phone terminal conducts multiband communication with a base station.

Like the RF power module of FIG. 1, the package of the RF power module RF_PA_Md shown in FIG. 3 also includes: an RF power amplifier RFPA formed in the GaAs semiconductor chip of a GaAs-MMIC; and a power-control unit Pwr_Cnt formed in the silicon semiconductor chip of a CMOS monolithic integrated circuit.

The RF power module RF_PA_Md of FIG. 3 is supplied, form the left side, with a high-band RF transmit input signal RFin_HB, a low-band RF transmit input signal RFin_LB, and a battery voltage Vbat of 3.1 to 4.2 volts, which comes from a lithium-ion battery pack of the mobile-phone terminal. The high-band RF transmit input signal RFin_HB represents RF transmit signals of 1850 to 1910 MHz of PCS1900 and 1710 to 1785 MHz of DCS1800. The low-band RF transmit input signal RFin_LB represents RF transmit signals of 889 to 915 MHz of a GSM900 and 824 to 849 MHz of a GSM850.

The high-band RF transmit input signal RFin_HB and low-band RF transmit input signal RFin_LB are supplied through strip lines SL1H and SL1L and capacitances C1H and C1L to the first and fifth terminals of the RF power amplifier RFPA, respectively. The battery voltage Vbat is supplied to eight terminals of the zeroth to seventh terminals, of the power-control unit Pwr_Cnt. Now, it is noted that the fourth terminal of the RF power amplifier RFPA is a ground terminal, which is coupled to the ground potential GND.

To the eleventh, twelfth and thirteenth terminals of the RF power module RF_PA_Md in lower portions of FIG. 3, a mode-control signal Mod_Sg, an automatic power-control signal Vapc (ramp-control voltage Vramp) and a transmit enable signal Tx_En are supplied respectively. Through the fourteenth terminal in a lower portion of the RF power module RF_PA_Md, a shutdown output signal Sh_Dwn, which is to be supplied to at least one of the baseband processing unit and the application processing unit from a control unit Cnt of the power-control unit Pwr_Cnt, is output. The shutdown output signal Sh_Dwn from the control unit Cnt of the power-control unit Pwr_Cnt is brought into High level "1" during the period of the overcurrent-cutoff-protecting action by the LDO type regulator Reg of the power-control unit Pwr_Cnt as in the case of FIG. 1. As a result, the liquid crystal display unit can display a warning display. The twenty-third terminal of the power-control unit Pwr_Cnt is a ground terminal. To the twenty-fourth terminal is connected a sensing resistance Rsen which is an externally attached discrete part. Through seven terminals of the sixteenth to twenty-second terminals of the power-control unit Pwr_Cnt, a collector source voltage $V_{LDO}$ produced by the LDO type regulator Reg is supplied to the RF power amplifier RFPA.

During the time when the mode-control signal Mod_Sg is in the period of a test mode, a test-bias voltage is applied to an evaluation transistor Q0 from the control unit Cnt of the power-control unit Pwr_Cnt through the ninth terminal and the sixth terminal of the RF power amplifier RFPA.

During the time when the mode-control signal Mod_Sg shows a high-band RF transmit mode, a high-band bias voltage Vbias_HB arises from the control unit Cnt of the power-control unit Pwr_Cnt through the tenth terminal. The high-band bias voltage Vbias_HB is supplied to bases of high-band-RF-transmit-signal-amplifying transistors Q1H, Q2H and Q3H through the second terminal of the RF power amplifier RFPA. Therefore, the high-band RF transmit input signal RFin_HB supplied to the first terminal of the RF power amplifier RFPA is sequentially amplified by the dependently connected transistors Q1H, Q2H and Q3H. To collectors of the transistors Q1H and Q2H, a collector source voltage $V_{LDO}$ is supplied by the LDO type regulator Reg of the power-control unit Pwr_Cnt through the twenty-third and twenty-second terminals and load inductors of the RF power amplifier RFPA. Further, to a collector of the transistor Q3H, the collector source voltage $V_{LDO}$ is supplied by the LDO type regulator Reg of the power-control unit Pwr_Cnt through five terminals of the seventeenth to twenty-first terminals of the RF power amplifier RFPA and the load inductors.

As a result, a high-band RF transmit output signal RFout_HB arises after passing through the five terminals of the seventeenth to twenty-first terminals of the RF power amplifier RFPA and a high-band-output-matching circuit MN_HB. The high-band RF transmit output signal RFout_HB is supplied to an antenna of the mobile-phone terminal, which is not shown in the drawing, and also supplied to a high-band-power-sensing directional coupler PCplr_HB. A part of the high-band RF transmit output signal RFout_HB coming from the high-band-power-sensing directional coupler PCplr_HB is detected by e.g. a power-detecting circuit of RFIC (not shown), and the resultant RF power detected output signal is supplied to one input terminal of an error amplifier of RFIC.

During the time when the mode-control signal Mod_Sg shows a low-band RF transmit mode, a low-band bias voltage Vbias_LB arises from the control unit Cnt of the power-control unit Pwr_Cnt through the eighth terminal. The low-band bias voltage Vbias_LB is supplied to bases of high-band-RF-transmit-signal-amplifying transistors Q1L, Q2L and Q3L through the third terminal of the RF power amplifier RFPA. Therefore, the low-band RF transmit input signal RFin_LB supplied to the fifth terminal of the RF power amplifier RFPA is sequentially amplified by the dependently connected transistors Q1L, Q2L and Q3L. To collectors of the transistors Q1L and Q2L, the collector source voltage $V_{LDO}$ is supplied by the LDO type regulator Reg of the power-control unit Pwr_Cnt through the seventh and eighth terminals and load inductors of the RF power amplifier RFPA. Further, to a collector of the transistor Q3L, the collector source voltage $V_{LDO}$ is supplied by the LDO type regulator Reg of the power-control unit Pwr_Cnt through eight terminals of the ninth to sixteenth terminals of the RF power amplifier RFPA and the load inductors.

As a result, a low-band-output-matching circuit MN_LB accepts a signal output through the eight terminals of the ninth to sixteenth terminals of the RF power amplifier RFPA to produce a low-band RF transmit output signal RFout_LB. The low-band RF transmit output signal RFout_LB is supplied to the antenna of the mobile-phone terminal, which is not shown in the drawing, and also supplied to a low-band-power-sensing directional coupler PCplr_LB. A part of the low-band RF transmit output signal RFout_LB coming from the low-band-power-sensing directional coupler PCplr_LB is detected by e.g. the power-detecting circuit of RFIC (not shown), and the resultant RF power detected output signal is supplied to one input terminal of the error amplifier of RFIC.

<<Polar Loop Transmitter with a Combination of the RF Power Module and RFIC>>

Figure 4:
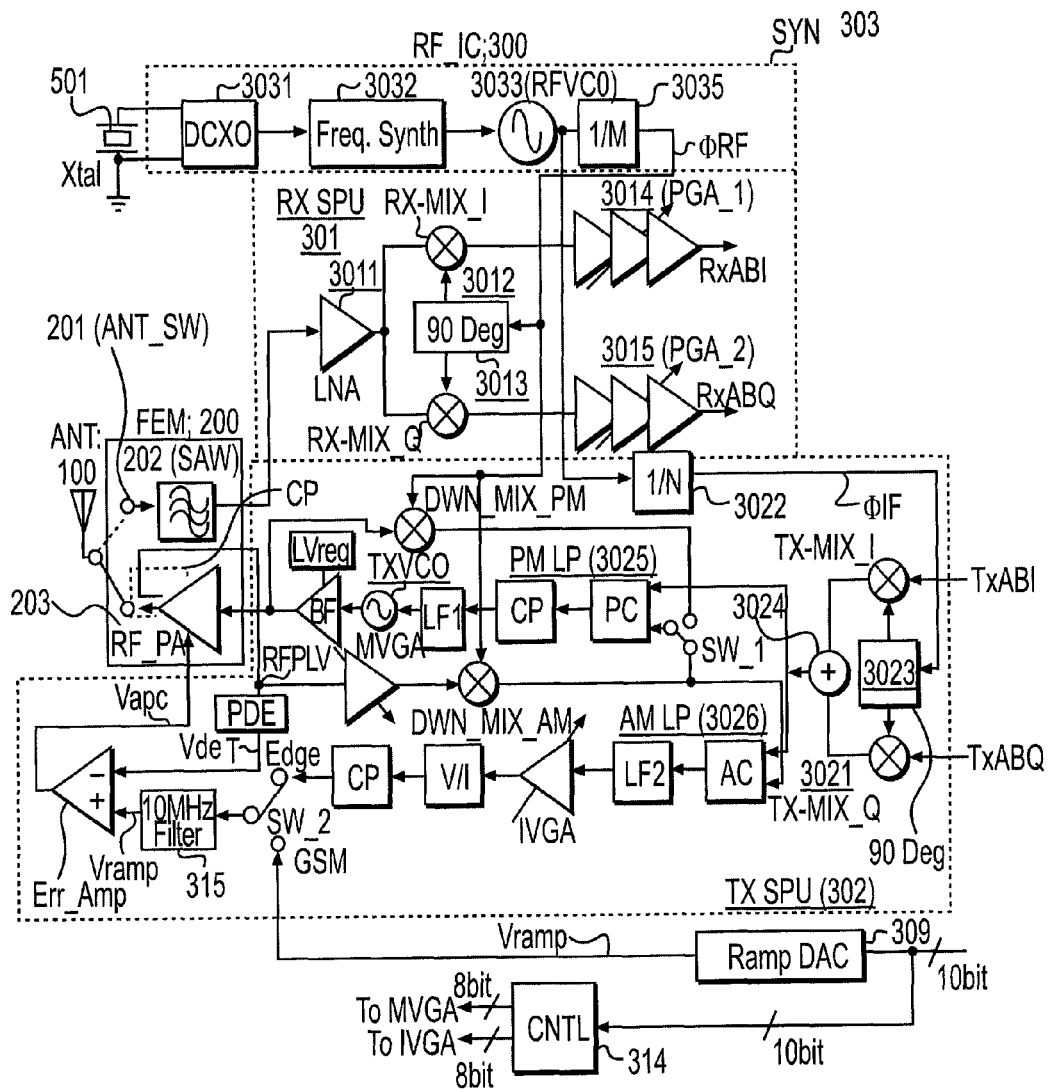
FIG. 4 is a diagram showing a whole configuration of a polar loop transmitter of a mobile-phone terminal with a combination of the RF power module according to the embodiment of the invention shown in FIG. 1 and a communication-purpose semiconductor integrated circuit.

FIG. 4 is a diagram showing a whole configuration of a polar loop transmitter of a mobile-phone terminal with a combination of the RF power module according to the embodiment of the invention shown in FIG. 1 and a communication-purpose semiconductor integrated circuit (RFIC). For this RFIC, a transmission system of the polar loop system is adopted for supporting an EDGE system which uses amplitude modulation together with phase modulation for communication with a base station and a communication terminal device. In FIG. 4, the transmitting RF power amplifier 203 represents the RF power module according to the embodiment of the invention, which has been described with reference to FIG. 1.

The semiconductor chip 300, which is an RFIC, includes three subunits 301, 302 and 303. In addition to RFIC 300, the antenna 100 for transmission and reception in a mobile-phone-terminal device, and a front-end module 200 are shown in FIG. 4. The front-end module 200 includes: an antenna switch 201 (ANTSW); a transmitting RF power amplifier 203; and a power coupler CPL for sensing a transmission power from the transmitting RF power amplifier 203.

The reference numeral 303 denotes an RF carrier synchronous subunit SYN, in FIG. 4. As to the RF carrier synchronous subunit 303 (SYN), the oscillation frequency of a system-reference-clock oscillator 3031 (DCXO) is kept stable by a quartz oscillator 501 (Xtal) outside the integrated circuit RFIC. A frequency synthesizer 3032, to which a system-reference-clock signal kept at the stable oscillation frequency from the system-reference-clock oscillator 3031 (DCXO) is applied, keeps the RF oscillation frequency of an RF oscillator 3033 (RFVCO) stable. An RF output from the RF oscillator 3033 (RFVCO) is supplied to a divider 3035 (1/M), whereby an RF signal ΦRF is obtained from an output of the divider 3035 (1/M). The RF signal ΦRF is supplied to an RF-receive-signal analog-signal-processing subunit 301 (RX SPU) and an RF-transmit-signal analog-signal-processing subunit 302 (TX SPU) inside the RF-analog-signal-processing integrated circuit RFIC for communication. In other words, this RF-transmit-signal analog-signal-processing subunit 302 (TX SPU) is configured according to the polar loop system for supporting EDGE system.

In a time slot set into a receive state, the antenna switch 201 (ANT_SW) of the front-end module 200 (FEM) is connected to an upper side. Therefore, an RF receive signal received by the antenna 100 is supplied to an input of a low-noise amplifier 3011 (LNA) of the RF-receive-signal analog-signal-processing subunit 301 (RX SPU) through a receive filter 202 (SAW) composed of e.g. a surface-acoustic-wave device. An RF amplified output signal from the low-noise amplifier 3011 (LNA) is supplied to one inputs of a pair of mixing circuits RX-MIX_I and RX-MIX_Q which constitute a receive mixer 3012. To the other inputs of the pair of mixing circuits RX-MIX_I and RX-MIX_Q, a pair of RF receive carrier signals having a phase difference of 90 degrees, which is formed based on the RF signal ΦRF from the divider 3035 (1/M) by a 90-degree phase shifter 3013 (90 Deg), is supplied. As a result, direct-down frequency conversion from an RF receive signal frequency to a baseband signal frequency is executed by the pair of mixing circuits RX-MIX_I and RX-MIX_Q of the receive mixer 3012, and receive-analog-baseband signals RxABI and RxABQ are obtained from an output of the mixer. The receive-analog-baseband signals RxABI and RxABQ are amplified by variable-gain amplifiers 3014 and 3015 whose gains have been adjusted in setting of a receive-time slot, and then converted into digital signals by an analog-to-digital converter in the chip of RFIC. The resultant digital receive signals are supplied to a baseband-signal-processing LSI, which is not shown in the drawing.

In a time slot set in a transmit state, a digital transmit baseband signal is supplied to RFIC from the baseband-signal-processing LSI, which is not shown in the drawing. As a result, a pair of analog baseband transmit signals TxABI and TxABQ is supplied to one inputs of a pair of mixing circuits TX-MIX_I and TX-MIX_Q of a transmit mixer 3021 of the RF-transmit-signal analog-signal-processing subunit 302 (TX SPU) from an output of a digital-to-analog converter inside RFIC, which is not shown in the drawing. When the RF signal ΦRF sent out from the output of the divider 3035 (1/M) is divided in frequency by another divider 3022 (1/N), a signal ΦIF of an intermediate frequency (hereinafter referred to as "IF") of about 80 MHz is formed. A pair of IF transmit carrier signals having a phase difference of 90 degrees, which is formed based on the IF signal ΦIF by a 90-degree phase shifter 3023 (90 Deg), is supplied to the other inputs of the pair of mixing circuits TX-MIX_I and TX-MIX_Q. As a result, the frequency-up conversion from the frequency of the analog baseband transmit signals to IF of a transmit signal is executed by the pair of mixing circuits TX-MIX_I and TX-MIX_Q of the transmit mixer 3021, and then an IF transmit modulated signal resulting from vector synthesis is offered by an adder 3024. The IF transmit modulated signal from the adder 3024 is supplied to one input of a phase comparator PC included in a PM loop circuit 3025 (PM LP) for sending a phase-modulated component in the RF-transmit-signal analog-signal-processing subunit 302 (TX SPU). In the PM loop circuit 3025 (PM LP), an output from the phase comparator PC is sent to a control input of a transmitting oscillator TXVCO through a charge pump CP and a low-pass filter LF1.

Further, in FIG. 4 a buffer amplifier BF having an input connected with an output of the transmitting oscillator TXVCO is supplied with an operating voltage from a voltage regulator Vreg. An output from the transmitting voltage-control oscillator TXVCO is supplied to an input of a PM loop frequency down mixer DWN_MIX_PM, which is supplied with the RF signal ΦRF from the divider 3035 (1/M), whereby a first IF transmit feedback signal is offered from an output of the down mixer DWN_MIX_PM. When a transmit-time slot is of a GSM system, the first IF transmit feedback signal is supplied through a switch SW_1 to the other input of the phase comparator PC included in the PM loop circuit 3025 (PM LP). As a result, a transmission power signal at an output of the transmitting RF power amplifier 203 contains correct phase modulation information of a GSM system. On the other hand, when a transmit-time slot is of a GSM system, a ramp output voltage Vramp of a ramp signal digital-to-analog converter 309 (Ramp DAC) in the RF-analog-signal-processing integrated circuit 300 is supplied to a 10-MHz filter 315 through a switch SW2. The ramp output voltage Vramp from the filter 315, and the transmission-power-sense signal Vdet from the power coupler CPL for sensing a transmission power of the transmitting RF power amplifier 203 and the power detector PDET are supplied to an error amplifier Err_Amp. Under the collector source voltage control according to an automatic power control voltage Vapc from an output of the error amplifier Err_Amp and the base bias voltage control, the amplification gain of the transmitting RF power amplifier 203 is set in proportion to the distance between a base station and the mobile communication terminal device. It is noted that a digital ramp input signal supplied to the ramp signal digital-to-analog converter 309 from a baseband-signal-processing unit such as a baseband LSI is a transmission-power-level-indicator signal showing the level of transmission power, and it is for controlling the level of transmission power to become higher in proportion to the distance between a base station and the communication terminal device. The ramp output voltage Vramp in analog is produced from an output of the ramp signal digital-to-analog converter 309.

However, when a transmit-time slot is of an EDGE system, the IF transmit modulated signal from the adder 3024 will contain not only phase modulation information, but also amplitude modulation information. Therefore, the IF transmit modulated signal from the adder 3024 is supplied to not only the one input of the phase comparator PC included in the PM loop circuit 3025 (PM LP), but also one input of an amplitude comparator AC included in an AM loop circuit 3026 (AM LP). At this time, the output of the transmitting oscillator TXVCO is not supplied to the other input of the phase comparator PC through the PM loop frequency down mixer DWN_MIX_PM; rather, transmission power-related information (RF transmission power level RFPLV) from the transmitting RF power amplifier 203 will be supplied to the other input of the phase comparator PC through the power coupler CPL, variable-gain circuit MVGA and AM loop frequency down mixer DWN_MIX_AM. Also, the transmission power-related information (RF transmission power level RFPLV) from the transmitting RF power amplifier 203 is supplied to the other input of the amplitude comparator AC included in the AM loop circuit 3026 (AM LP) through the power coupler CPL, variable-gain circuit MVGA, and AM loop frequency down mixer DWN_MIX_AM. In the AM loop circuit 3026 (AM LP), an output from the amplitude comparator AC is supplied to the 10-MHz filter 315 through a low-pass filter LF2, a variable-gain circuit IVGA, a voltage-current converter V/I, a charge pump CP and the switch SW2. As a result, first with the aid of the PM loop circuit 3025 (PM LP), the transmission power signal as an output from the transmitting RF power amplifier 203 which amplifies an RF oscillating output signal from the transmitting oscillator TXVCO will contain correct phase modulation information of an EDGE system. Further, with the help of the AM loop circuit 3026 (AM LP), the transmission power signal as an output from the transmitting RF power amplifier 203 will contain correct amplitude modulation information of an EDGE system.

In the RF-analog-signal-processing integrated circuit 300 of FIG. 4, a control circuit 314 (CNTL) produces two 8-bit control signals in response to a 10-bit digital ramp signal so that the gains of the two variable-gain circuits MVGA and IVGA of the AM loop circuit 3026 (AM LP), which respond to the ramp voltage Vramp from the ramp signal digital-to-analog converter 309 (Ramp DAC), are opposite in direction to each other. Specifically, when the gain of the variable-gain circuit MVGA decreases in response to the ramp voltage Vramp, the gain of the variable-gain circuit IVGA increases, whereby the sum of the gains of the two variable-gain circuits MVGA and IVGA is made substantially constant. Thus, the remarkable shrinking of the phase margin of open loop frequency characteristics of the AM loop circuit 3026 in response to the ramp voltage Vramp is reduced.

<<Baseband-signal-processing LSI and Application Processor>>

Figure 5:
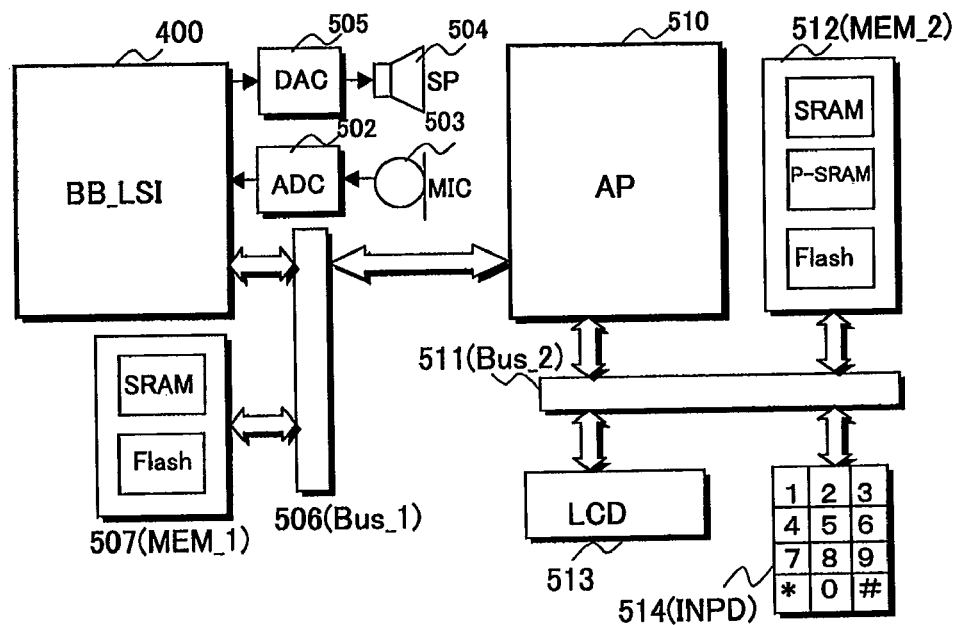
FIG. 5 is a diagram showing a baseband-signal-processing LSI and a device such as an application processor, which are connected with RFIC shown in FIG. 4.

FIG. 5 is a diagram showing a baseband-signal-processing LSI and a device such as an application processor, which are connected with RFIC shown in FIG. 4.

The baseband-signal-processing LSI 400 of FIG. 5 supplies a pair of analog baseband transmit signals TxABI and TxABQ to RFIC shown in FIG. 4. Also, as shown in FIG. 5, the baseband-signal-processing LSI 400 can be connected through a first external bus 506 (Bus_1) to a first external memory 507 (MEM_1) and an application processor 510 (AP). The first external memory 507 (MEM_1) includes an SRAM utilized as a work memory of the baseband-signal-processing LSI 400 and a nonvolatile memory Flash which stores an operation program for the baseband-signal-processing LSI 400. The operation program stored in the nonvolatile memory Flash contains a program for phase demodulation for a receive baseband signal of a GSM system and phase modulation for a transmit baseband signal by a digital signal processor (DSP) inside the baseband processor core 401. Also, the nonvolatile memory Flash contains a program for phase and amplitude demodulation for a receive baseband signal of an EDGE system, and phase and amplitude modulation for a transmit baseband signal.

The application processor 510 (AP) connected with the baseband-signal-processing LSI 400 through the first external bus 506 is connected through a second external bus 511 (Bus_2) to a second external memory 512 (MEM_2), a liquid crystal display device 513 (LCD) and an operation-key input device 514 (INPD). The second external memory 512 (MEM_2) includes an SRAM utilized as a work memory of the application processor 510, a pseudo SRAM (P-SRAM) and a nonvolatile memory Flash which stores an operation program for the application processor 510. To the application processor 510 is connected a power switch (not shown) of the mobile-phone terminal through the second external bus 511 (Bus_2), further.

In addition, according to a preferred embodiment of the invention, the nonvolatile memory Flash of the second external memory 512 (MEM_2) contains a boot program of a mobile terminal device (for initialization at the time of power-on or reset of the mobile terminal device) and an operating system program (OS). Further, in the nonvolatile memory Flash of the second external memory 512, a running program in a general-purpose programming language and various application programs of an electronic game and others can be stored. Also, the setting of an action on a time slot in the time division multiple access system can be made by the boot program or OS of a mobile terminal device.

The baseband-signal-processing LSI 400 and the application processor 510 are formed in separate semiconductor chips respectively. However, in another embodiment, the application processor 510 is integrated into an integrated one-chip with the semiconductor chip of the baseband-signal-processing LSI 400. In still another embodiment, the RF-analog-signal-processing unit 300 is further integrated with the integrated one-chip with the baseband-signal-processing LSI 400 and application processor 510 integrated thereinto.

In addition, as shown in FIG. 5, the shutdown output signal Sh_Dwn from the RF power module of FIG. 1 or 3 is supplied to at least one of the baseband-signal-processing LSI 400 and the application processor 510. As a result, a user can recognize from a warning display by the liquid crystal display device 513 (LCD) of the mobile-phone terminal that the overcurrent-cutoff-protecting action is being executed by the regulator Reg in the power-control unit Pwr_Cnt of the RF power module.

<<Switching Regulator Type Integrated DC-DC Converter>>

The regulator to form a polar loop transmitter of an EDGE system according to the invention, which is used for ramping of a collector source voltage supplied to the RF power amplifier in response to the ramp-control voltage Vramp, is not limited to an LDO type series regulator as in the above-described embodiment. As such regulator, a switching regulator type DC-DC converter having an extremely high power efficiency may be used.

FIG. 9 is a diagram showing a configuration of an integrated DC-DC converter according to another embodiment of the invention, which is mounted on an RF power amplifier module of a GSM-EDGE transmission system.

The integrated DC-DC converter of FIG. 9 is formed in an integrated circuit (IC). A battery voltage Vbat in a voltage range between 2.3 and 4.7 volts is supplied to an input terminal $T_1$ of the integrated DC-DC converter from a lithium-ion battery BT, whereby an output voltage $V_{OUT}$ in a voltage range between 0.5 and 5 volts is produced from an output terminal $T_2$. The output voltage $V_{OUT}$ is supplied to the RF power amplifier as a collector source voltage. The integrated DC-DC converter has a ground terminal $T_3$ coupled with the ground potential, a control input terminal $T_4$ supplied with a ramp-control voltage Vramp, and a feedback terminal $T_5$ supplied with a feedback voltage $V_{FB}$. Between terminals $T_6$ and $T_7$ is connected a smoothing inductor $L_{12}$. Further, to the input terminal $T_1$ is connected an input-smoothing capacitance $C_{IN}$; an output-smoothing capacitance $C_{OUT}$ is connected to the output terminal $T_2$. Between the output terminal $T_2$ and ground voltage, two voltage-dividing resistances $R_{11}$ and $R_{12}$ connected in series are coupled. The feedback voltage $V_{FB}$ at the connection node between the two voltage-dividing resistances $R_{11}$ and $R_{12}$ is supplied to the feedback terminal $T_5$. For example, when the resistance values of the two voltage-dividing resistances $R_{11}$ and $R_{12}$ are set to the same value, the feedback voltage $V_{FB}$ at the feedback terminal $T_5$ is half the output voltage $V_{OPT}$ at the output terminal $T_2$. The two voltage-dividing resistances $R_{11}$ and $R_{12}$ may be integrated with the integrated circuit (IC) of the integrated DC-DC converter.

The integrated DC-DC converter (IC) of FIG. 9 includes: a controller 10; a back (voltage-dropping) converter 11; and a boost (voltage-raising) converter 12. In response to the level of the ramp-control voltage Vramp at the control input terminal $T_4$, a combination of the controller 10, the back (voltage-dropping) converter 11 and the boost (voltage-raising) converter 12 converts the battery voltage Vbat at the input terminal $T_1$ into the output voltage $V_{OUT}$ at the output terminal $T_2$. Under the control of the controller 10, the level of the output voltage $V_{OUT}$ at the output terminal $T_2$ follows the level of the ramp-control voltage Vramp at the control input terminal $T_4$, while the output voltage is directly proportional to the ramp-control voltage Vramp in level. The level of the feedback voltage $V_{FB}$ at the feedback terminal $T_5$ follows the level of the output voltage $V_{OUT}$ at the output terminal $T_2$.

As shown in a lower portion of FIG. 9, the ramp-control voltage Vramp and feedback voltage $V_{FB}$ are supplied to a non-inverting input terminal+ and an inverting input terminal− of an error amplifier EA of the controller 10. The error of the feedback voltage $V_{FB}$ with respect to the ramp-control voltage Vramp is amplified by the error amplifier EA of the controller 10, whereby an error-amplified-output voltage $V_{OE}$ is produced. A comparison between the error-amplified-output voltage $V_{OE}$ and a triangular-wave reference signal from a triangular-wave-reference oscillator OSC is made by comparators CMP1 and CMP2; the resultant comparison-output signals from the comparators CMP1 and CMP2 are supplied to a pulse-width modulation control logic 100. The back converter 11 and boost converter 12 are controlled according to a PWM output control signal from the pulse-width modulation control logic 100 of the controller 10. When the integrated DC-DC converter (IC) of FIG. 9 converts the battery voltage Vbat at the input terminal $T_1$ into the output voltage $V_{OUT}$ at the output terminal $T_2$, the levels of the feedback voltage $V_{FB}$ and output voltage $V_{OUT}$ are exactly controlled according to the level of the ramp-control voltage Vramp at the control input terminal $T_4$. The back converter 11 includes a back driver 110, a first PMOS ($MP_1$), and a first NMOS ($MN_1$). The boost converter 12 includes a boost driver 120, a second PMOS ($MP_2$) and a second NMOS ($MN_2$).

The second PMOS ($MP_2$) has a drain connected with the sources of the large-size P-channel MOS transistor Qp1 and small-size P-channel MOS transistor Qp2. The gates of the large-size PMOS transistor Qp1 and small-size PMOS transistor Qp2 are controlled by the controller 10. The drain of the large-size PMOS transistor Qp1 is connected to the output terminal $T_2$, and the drain of the small-size PMOS transistor Qp2 is connected through the sense terminal $T_3$ to the sensing resistance Rsen, which is an external discrete part. The sense current Isen of the small-size PMOS transistor Qp2 is converted by the sensing resistance Rsen into the sense voltage Vsen. The sense voltage Vsen is supplied to a shutdown controller Sh_Cnt of the controller 10. As in the case of FIG. 1, the shutdown controller Sh_Cnt includes comparators Cmp1 and Cmp2, a latch FF1, two inverters Inv1 and Inv2, a NAND circuit NAND3 and an inverter Inv3.

Therefore, when the source current from the large-size PMOS transistor Qp1 to the RF power amplifier is made excessively large owing to the decrease in the impedance of the antenna or the failure of the final-stage power transistor of the RF power amplifier, the sense current Isen of the small-size PMOS transistor Qp2 is also increased, and then the sense voltage Vsen is made High level. The controller 10 controls the back driver 110 in response to that, whereby the first PMOS ($MP_1$) of the back converter 11 is controlled and turned off. Thus, the integrated DC-DC converter of FIG. 9 is wholly controlled into the shutdown condition, and the source current to the RF power amplifier is also cut off. In this way, the drain of the battery of a mobile-phone terminal can be reduced even when an impedance mismatch condition lasts for a long time in the output-matching circuit of the RF power amplifier.

While the integrated DC-DC converter of FIG. 9 is wholly controlled to be in the shutdown condition, the shutdown output signal Sh_Dwn of High level "1" from the controller 10 is supplied to at least one of the baseband processing unit and the application processing unit. As a result, the user can recognize from a warning display by the liquid crystal display unit of the mobile-phone terminal that the overcurrent-cutoff-protecting action is being executed.

<<Voltage-dropping Action by the Integrated DC-DC Converter>>

It is assumed that the lithium-ion battery BT supplies the battery voltage Vbat having a voltage level of 4.0 volts, and the ramp-control voltage Vramp having a voltage level of 1.0 volt is supplied to the control input terminal $T_4$. Then, the back converter 11 of the integrated DC-DC converter (IC) of FIG. 9 performs voltage-down-conversion of the battery voltage Vbat of 4.0-volt voltage level into the output voltage $V_{OUT}$ of 2.0-volt voltage level.

The voltage conversion rate of the PWM-controlled back converter 11 depends on its ON period $T_{ON}$ and OFF period $T_{OFF}$. The ON period $T_{ON}$ is a period of time during which the first PMOS ($MP_1$) of the back converter 11 stays in ON, and the first NMOS ($MN_1$) is in OFF. The OFF period $T_{OFF}$ is a period of time during which the first PMOS ($MP_1$) of the back converter 11 is in OFF, and the first NMOS ($MN_1$) is in ON. According to the PWM-controlled back converter 11, the output voltage $V_{OUT}$ has a value lower than the battery voltage Vbat depending on the ON period $T_{ON}$ and OFF period $T_{OFF}$, which is as presented by the following expression.

$$V_{OUT} = Vbat \times T_{ON}/(T_{ON}+T_{OFF}) \quad \text{(Expression 2)}$$

When the ON period $T_{ON}$ and the OFF period $T_{OFF}$ are set to the same time, an output voltage $V_{OUT}$ of 2.0-volt level, which is half the battery voltage Vbat of 4.0 volts, is produced.

Incidentally, during the time of the voltage-dropping action by the back converter 11, the second PMOS ($MP_2$) of the boost converter 12 is kept in ON state constantly, and the output voltage $V_{OUT}$ resulting from the voltage-dropping action by the back converter 11 can be supplied to the output terminal $T_2$.

<<Voltage-raising Action by the Integrated DC-DC Converter>>

It is assumed that the lithium-ion battery BT supplies the battery voltage Vbat having a voltage level of 2.0 volts, and the ramp-control voltage Vramp having a voltage level of 2.0 volts is supplied to the control input terminal $T_4$. Then, the boost converter 12 of the integrated DC-DC converter (IC) of FIG. 9 performs voltage-up-conversion of the battery voltage Vbat of 2.0-volt voltage level into the output voltage $V_{OUT}$ of 4.0-volt voltage level.

The voltage conversion rate of the PWM-controlled boost converter 12 depends on its ON period $T_{ON}$ and OFF period $T_{OFF}$. The ON period $T_{ON}$ is a period of time during which the second NMOS ($MN_2$) of the boost converter 12 stays in ON, and the second PMOS ($MP_2$) is in OFF. The OFF period $T_{OFF}$ is a period of time during which the second NMOS ($MN_2$) of the boost converter 12 is in OFF, and the second PMOS ($MP_2$) is in ON. According to the PWM-controlled boost converter 12, the output voltage $V_{OUT}$ has a value higher than the battery voltage Vbat depending on the ON period $T_{ON}$ and OFF period $T_{OFF}$, which is as presented by the following expression.

$$V_{OUT} = Vbat \times (T_{ON}+T_{OFF})/T_{OFF} \quad \text{(Expression 3)}$$

Incidentally, during the time of the voltage-raising action by the boost converter 12, the first PMOS ($MP_1$) of the back converter 11 is kept in ON state constantly, and the battery voltage Vbat from the battery BT is supplied to one end of the smoothing inductor $L_{12}$.

<–Through Action by the Integrated DC-DC Converter>>

It is assumed that the lithium-ion battery BT supplies the battery voltage Vbat having a voltage level of about 3.6 volts, and the ramp-control voltage Vramp having a voltage level of about 1.8 volts is supplied to the control input terminal $T_4$.

Then, the back converter 11 and boost converter 12 of the integrated DC-DC converter (IC) of FIG. 9 convert the battery voltage Vbat having a voltage level of about 3.6 volts into the output voltage $V_{OUT}$ having a voltage level of about 3.6 volts in a voltage-through manner.

The invention made by the inventor has been described above based on the embodiments specifically. However, it is needless to say that the invention is not limited so, and various changes and modifications maybe made without departing from the subject matter hereof.

For example, in FIG. 1, a coupler which senses the transmission power of the RF power amplifier electromagnetically or capacitively may be adopted as the power-sensing directional coupler Pcpl for sensing the transmission power of the transmitting RF power amplifier. Other than that, a current-sensing-type detector maybe adopted as the power-sensing coupler. In use, a sensing-amplifier device of the current-sensing-type detector is connected in parallel with the final-stage power amplifier device of the RF power amplifier, and a small sensing DC/AC operating current proportional to DC/AC operating current of the final-stage power amplifier device is made to pass through the sensing-amplifier device.

In addition, as the RF-transmit-signal-amplifying transistors Q1H, Q2H, Q3H, Q1L, Q2L and Q3L of FIG. 3, not only GaAs heterojunction bipolar transistors (HBTs) but also silicon-germanium type HBTs may be used. The silicon-germanium type HBT has a base layer made of silicon and germanium and having a narrow bandgap, and an emitter layer of silicon with a wide bandgap.

Also, the RF-transmit-signal-amplifying transistor may be a silicon power MOS transistor, which is termed LD (Lateral Diffused) MOS.

As a result, as to the RF power module RF_PA_Md of FIG. 3, the RF power amplifier RFPA and the power-control unit Pwr_Cnt can be formed in a single-chip monolithic integrated circuit of CMOS or BiCMOS.

Further, the invention is applicable to not only a cutoff type overcurrent-protection method but also an overcurrent-protection method according to the current-limiting method.

With the current-limiting method of this case, in FIG. 1 the P-channel MOS transistor Qp4 as the shutdown switch Sh_SW is omitted therefrom, and the battery voltage Vbat is directly supplied to the sources of the large-size PMOS Qp1 and small-size PMOS Qp1 of the LDO type regulator Reg.

The output voltage of the comparator Comp1, whose inverting input terminal (−) is supplied with the reference voltage Vsh from the voltage generator circuit V_gen, and whose non-inverting input terminal (+) is supplied with the sense voltage Vsen of the sensing resistance Rsen, is supplied to the gates of the large-size PMOS Qp1 and small-size PMOS Qp1 of the LDO type regulator Reg.

Therefore, when the source current of the RF power amplifier is increased owing to the decrease in the impedance of the antenna or the failure of the power transistor of the final amplification stage, the sense voltage Vsen of the sensing resistance Rsen is increased. The comparator Cmp1 is composed of a differential amplifier, and therefore, when the sense voltage Vsen at the non-inverting input terminal (+) is increased to the level of the reference voltage Vsh at the inverting input terminal (−), the output voltage level of the comparator Cmp1 is raised. As the output of the comparator Cmp1 raises the gate voltage levels of the large-size PMOS Qp1 and small-size PMOS Qp1 of the LDO type regulator Reg, the drain currents of the large-size PMOS Qp1 and small-size PMOS Qp1 are never increased to or above it. Thus, the overcurrent-protection method according to the current-limiting method can be materialized.

Also, the comparator Cmp1 is constituted by a differential transistor pair of N-channel MOS transistors Qn1 and Qn2 inside the CMOS monolithic integrated circuit, and therefore overcurrent protection according to the current-limiting method, which the device variation has a small influence on, can be achieved.

Further, the invention is applicable to mobile-phone terminals of WCDMA system which utilize Code Division Multiple Access (CDMA) in addition to GSM system and EDGE system, which utilize Time Division Multiple Access (TDMA).

In CDMA system, time-division switching between sending and receiving functions on a transmit-time slot and a receive-time slot as conducted in TDMA system is not performed, and a combination of parallel transmission and reception utilizing the difference between a low transmit RF frequency and a high receive RF frequency is performed instead. Therefore, automatic resuming of power supply after execution of the overcurrent-cutoff-protecting action is executed in response to the repower-on of a mobile-phone terminal by a user operation or start of a phone call.

What is claimed is:

1. An RF power amplifier apparatus comprising:
   an RF power amplifier; and
   a power-supply circuit,
   wherein the power-supply circuit and the RF power amplifier are formed inside a package,
   wherein the power-supply circuit supplies the RF power amplifier with a source voltage,
   wherein the power-supply circuit is arranged so as to control a level of the source voltage supplied to the RF power amplifier in response to a level of a power-control signal,
   wherein the power-supply circuit includes a source-current-sensing circuit for producing a sense signal corresponding to a source current with respect to the source voltage supplied to the RF power amplifier,
   wherein the power-supply circuit includes a current-control unit for controlling a level of the source current with respect to the source voltage in response to a level of the sense signal produced by the source-current-sensing circuit, and
   wherein the current-control unit is arranged so as to respond to coincidence of a level of the sense signal produced by the source-current-sensing circuit with an allowable sense signal level corresponding to and allowable level of the source current and control the source current to a limit current set to be smaller than the allowable level of the source current,
   wherein the current-control unit includes a shutdown switch,
   wherein the shutdown switch of the current-control unit is controlled into its OFF state in response to coincidence of a level of the sense signal produced by the source-current-sensing circuit with the allowable sense signal level, and
   wherein the limit current is a shutdown current when the shutdown switch of the current-control unit is in the OFF state.

2. The RF power amplifier apparatus according to claim 1,
   wherein the current-control unit includes a latch,
   wherein the RF power amplifier executes an action of transmission of a transmit-time slot of a GSM system,
   wherein the power-control signal supplied to the power-supply circuit makes a ramp-control voltage for ramp-up and ramp-down in the transmit-time slot of the GSM system, wherein the latch of the current-control unit is set into one state in the ramp-up according to the ramp-control voltage, whereby the power-supply circuit automatically supplies the RF power amplifier with the source voltage and the source current, and wherein when the latch of the current-control unit is set into another state differing from the one state in response to coincidence of the level of the sense signal produced by the source-current-sensing circuit with the allowable sense signal level, the latch of the current-control unit controls the shutdown switch into the OFF state.

3. The RF power amplifier apparatus according to claim 2, wherein the power-control signal makes an AM control input signal of EDGE system, and wherein the RF power amplifier also executes an action of transmission of a transmit-time slot of EDGE system.

* * * * *